(12) United States Patent
Yamaguchi et al.

(10) Patent No.: US 9,972,664 B2
(45) Date of Patent: May 15, 2018

(54) ORGANIC ELECTROLUMINESCENT DISPLAY PANEL

(71) Applicant: JOLED INC., Tokyo (JP)

(72) Inventors: Jun Yamaguchi, Tokyo (JP); Makoto Ando, Tokyo (JP)

(73) Assignee: JOLED INC., Tokyo (JP)

( * ) Notice: Subject to any disclaimer, the term of this patent is extended or adjusted under 35 U.S.C. 154(b) by 0 days. days.

(21) Appl. No.: 15/611,023

(22) Filed: Jun. 1, 2017

(65) Prior Publication Data

US 2017/0352708 A1 Dec. 7, 2017

(30) Foreign Application Priority Data

Jun. 6, 2016 (JP) ................................. 2016-112847

(51) Int. Cl.
*H01L 27/32* (2006.01)
*H01L 51/50* (2006.01)
*H01L 51/56* (2006.01)

(52) U.S. Cl.
CPC ........ *H01L 27/3218* (2013.01); *H01L 27/326* (2013.01); *H01L 27/3211* (2013.01); *H01L 27/3246* (2013.01); *H01L 27/3248* (2013.01); *H01L 51/504* (2013.01); *H01L 51/5056* (2013.01); *H01L 51/5072* (2013.01); *H01L 51/5092* (2013.01); *H01L 51/56* (2013.01)

(58) Field of Classification Search
CPC ............... H01L 27/326; H01L 27/3248; H01L 2251/5315; H01L 27/3206–27/3218; H01L 27/3246; H01L 27/322; H01L 51/56; H01L 51/5036–51/5092
See application file for complete search history.

(56) References Cited

U.S. PATENT DOCUMENTS 8,330,172 B2 * 12/2012 Choi .................... H01L 27/3246
257/88
8,957,412 B2 * 2/2015 Yamada .............. H01L 51/5265
257/40

(Continued)

FOREIGN PATENT DOCUMENTS

| JP | 2007-287691 | 11/2007 |
| JP | 2012-216338 | 11/2012 |
| JP | 2015-128065 | 7/2015 |

*Primary Examiner* — Marvin Payen
*Assistant Examiner* — Jeremy Joy
(74) *Attorney, Agent, or Firm* — Greenblum & Bernstein, P.L.C.

(57) ABSTRACT

An organic EL display panel including: a substrate; pixel electrodes that are arrayed in a matrix above the substrate; first organic functional layers that are on or above the pixel electrodes in one-to-one correspondence with the pixel electrodes, the first organic functional layers spaced apart from one another; a second organic functional layer that continuously covers the first organic functional layers; and a counter electrode that opposes the pixel electrodes and covers the second organic functional layer. In the organic EL display panel, the first organic functional layers each include a hole injection layer, and the second organic functional layer has greater electric resistance than each of the first organic functional layers and has a portion extending into an absence region, the absence region being a space between adjacent ones of the first organic functional layers.

4 Claims, 15 Drawing Sheets

(56) References Cited

U.S. PATENT DOCUMENTS

| | | | | |
|---|---|---|---|---|
| 9,318,538 B2* | 4/2016 | Chien | ............... | H01L 51/5036 |
| 9,698,382 B2* | 7/2017 | Kurata | ............... | H01L 51/5271 |
| 2003/0044639 A1* | 3/2003 | Fukuda | ............... | H01L 27/3211 |
| | | | | 428/690 |
| 2005/0057150 A1* | 3/2005 | Kim | ............... | H01L 27/3211 |
| | | | | 313/504 |
| 2005/0221124 A1* | 10/2005 | Hwang | ............... | C07F 9/5728 |
| | | | | 428/690 |
| 2006/0033425 A1* | 2/2006 | Miura | ............... | H01L 27/3211 |
| | | | | 313/504 |
| 2007/0241676 A1 | 10/2007 | Park et al. | | |
| 2008/0018239 A1* | 1/2008 | Matsuda | ............... | C09K 11/06 |
| | | | | 313/504 |
| 2008/0111474 A1* | 5/2008 | Sung | ............... | H01L 27/322 |
| | | | | 313/504 |
| 2009/0039769 A1* | 2/2009 | Matsunami | ............... | H01L 51/0056 |
| | | | | 313/504 |
| 2009/0108743 A1* | 4/2009 | Kobayashi | ............... | H01L 51/5281 |
| | | | | 313/504 |
| 2010/0090620 A1* | 4/2010 | Hack | ............... | H01L 27/3213 |
| | | | | 315/312 |
| 2010/0102310 A1* | 4/2010 | Komatsu | ............... | H01L 51/5088 |
| | | | | 257/43 |
| 2010/0181559 A1* | 7/2010 | Nakatani | ............... | H01L 27/3246 |
| | | | | 257/40 |
| 2011/0248247 A1* | 10/2011 | Matsumoto | ............... | C09K 11/06 |
| | | | | 257/40 |
| 2011/0303903 A1* | 12/2011 | Yoshinaga | ............... | H01L 51/0056 |
| | | | | 257/40 |
| 2011/0316414 A1* | 12/2011 | Nendai | ............... | H01L 51/0021 |
| | | | | 313/504 |
| 2012/0241780 A1* | 9/2012 | Kurata | ............... | H01L 27/3211 |
| | | | | 257/89 |
| 2012/0248475 A1* | 10/2012 | Yamada | ............... | H01L 27/322 |
| | | | | 257/89 |
| 2012/0261683 A1* | 10/2012 | Sonoyama | ............... | H01L 27/3211 |
| | | | | 257/89 |
| 2013/0193427 A1* | 8/2013 | Kurata | ............... | H01L 51/5265 |
| | | | | 257/40 |
| 2015/0188074 A1 | 7/2015 | Heo et al. | | |
| 2016/0276602 A1* | 9/2016 | Yoshinaga | ............... | C09K 11/06 |

* cited by examiner

Cross-section at high position (plane B-B')

Cross-section at low position (plane C-C')

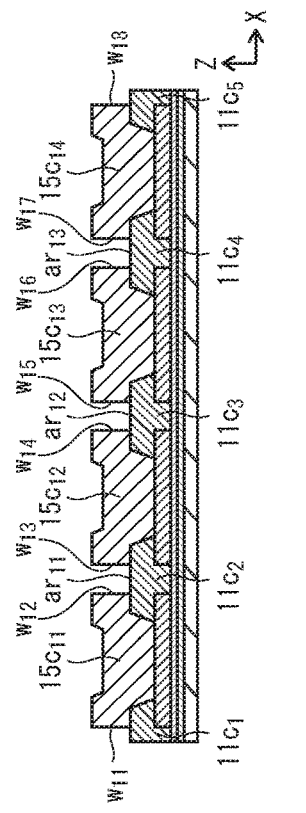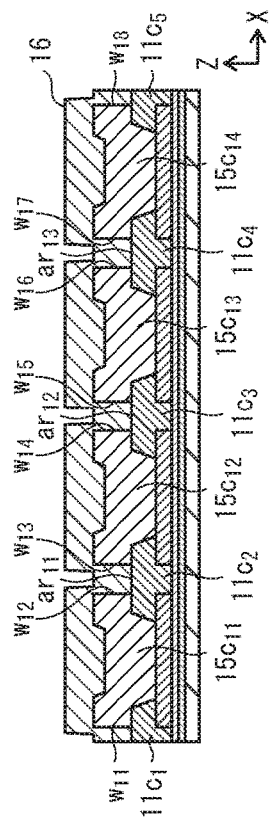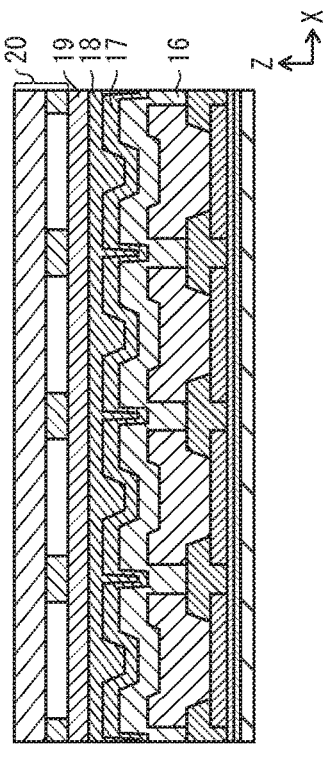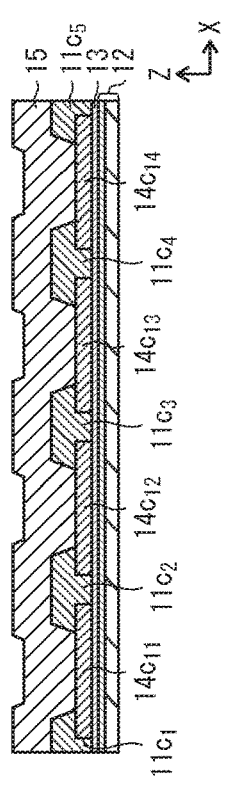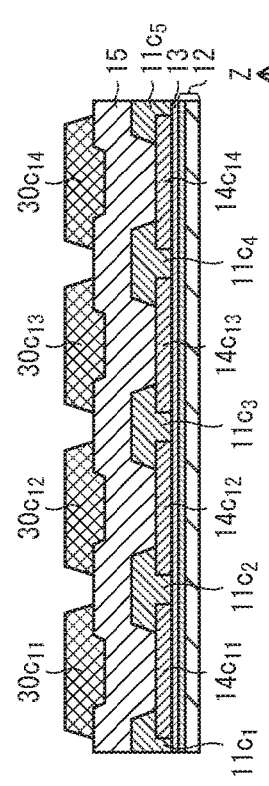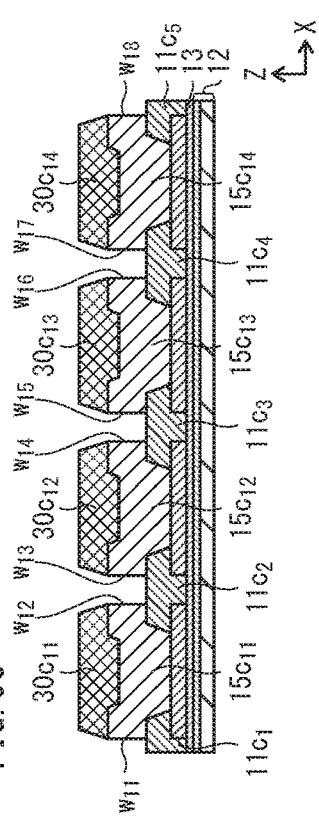

FIG. 12

| | Resist patterning | Ink-jet process | Shadow mask process |
|---|---|---|---|
| Advantages | ·Capable of achieving high definition | ·Improved efficiency in use of materials<br>·Low cost | ·Reduced influence of impurities |

ORGANIC ELECTROLUMINESCENT DISPLAY PANEL

This application is based on an application No. 2016-112847 filed in Japan, the contents of which are hereby incorporated by reference.

BACKGROUND OF THE DISCLOSURE

(1) Technical Field

The present disclosure relates to an organic electroluminescence (EL) display panel, in particular to a structure of a display panel including an organic light-emitting layer that is common to a plurality of pixels.

(2) Description of Related Art

A laminate-type white light-emitting layer is known as an organic light-emitting layer that is common to a plurality of pixels. Such a laminate-type white light-emitting layer may be (i) a laminate including a thin red organic light-emitting layer, a thin green organic light-emitting layer, and a thin blue organic light-emitting layer; or (ii) a laminate including a thin yellow organic light-emitting layer and a thin blue organic light-emitting layer.

Display panels which include such a white light-emitting layer have color filters of red, green, and blue above the white light-emitting layer, and achieve emission of red light, green light, and blue light by using the color filters.

SUMMARY OF THE DISCLOSURE

(1) Problem to be Solved

In display panels including an organic light-emitting layer that is common to pixels, a leak current may occur beyond a boundary between pixels. Pixel regions each corresponding to one of the three primary colors of light, namely red, blue, and green, are adjacent to each other at a display surface. Accordingly, occurrence of a leak current as described above may cause slight light emission of one of the three primary colors which is not supposed to be emitted. Such slight light emission causes color mixture and/or color bleeding, and consequently causes quality deterioration of displayed images.

One aspect of the present disclosure aims to provide an organic EL display panel in which quality deterioration of displayed images caused by such slight light emission is prevented.

(2) Means for Solving Problem

An organic EL display panel pertaining to one aspect of the present disclosure includes: a substrate; pixel electrodes that are arrayed in a matrix above the substrate; first organic functional layers that are on or above the pixel electrodes in one-to-one correspondence with the pixel electrodes, the first organic functional layers spaced apart from one another; a second organic functional layer that continuously covers the first organic functional layers; and a counter electrode that opposes the pixel electrodes and covers the second organic functional layer. In the organic EL display panel, the first organic functional layers each include a hole injection layer, and the second organic functional layer has greater electric resistance than each of the first organic functional layers and has a portion extending into an absence region, the absence region being a space between adjacent ones of the first organic functional layers.

Effects of Present Disclosure

In the organic EL display panel pertaining to one aspect of the present disclosure, the first organic functional layers are on or above the pixel electrodes in one-to-one correspondence with the pixel electrodes and are spaced apart from one another. Accordingly, currents that flow from a pixel electrode to a light-emitting region of an adjacent pixel are blocked by a portion of the second organic functional layer extending into the absence region, which is a space between adjacent ones of the first organic functional layers. This prevents image quality deterioration caused by slight light emission from a primary color component which is not supposed to be emitted.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

FIG. 9A through FIG. 9F illustrate how an organic EL display panel is aimed through the steps of the flowchart in FIG. 8.

FIG. 12 is a table illustrating advantages of a resist process, an ink jet process, and a shadow mask process.

DESCRIPTION OF EMBODIMENTS

<Circumstances Leading to Aspect of Present Disclosure>

Figure 15A:
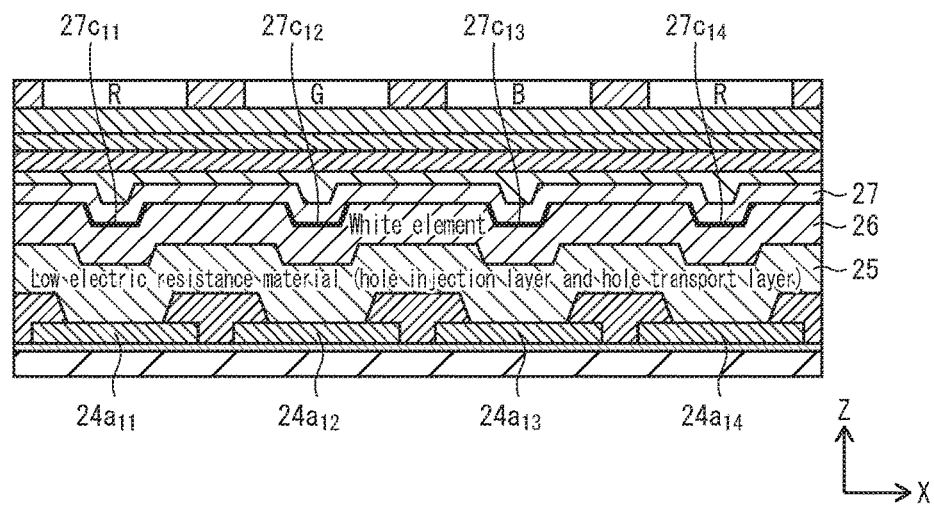
FIG. 15A illustrates an example of a structure of an organic EL display panel which employs a white light-emitting element as an organic light source and achieves emission of light of the three primary colors red, green, and blue by means of color filters.

In order to develop high-quality organic EL display panels, the inventor, in cooperation with one or more others, considered improvement of organic EL display panels which include a white light-emitting element as an organic light source. FIG. 15A illustrates an example of a conventional structure of an organic EL display panel which employs a white light-emitting element as the organic light source and achieves emission of light of the three primary colors red, green, and blue by means of color filters. In an organic EL display panel having this structure, a plurality of pixel electrodes including pixel electrodes $24a_{11}$, $24a_{12}$, $24a_{13}$, and $24a_{14}$ are arrayed in a matrix, and a low electric resistance layer 25 including a hole injection layer and a hole transport layer, a high electric resistance layer 26 including a laminate-type white light-emitting layer, and a common electrode 27 are laminated on the pixel electrodes. The common electrode 27 has counter portions $27c_{11}$, $27c_{12}$, $27c_{13}$, and $27c_{14}$ respectively facing the pixel electrodes $24a_{11}$, $24a_{12}$, $24a_{13}$, and $24a_{14}$.

Figure 15B:
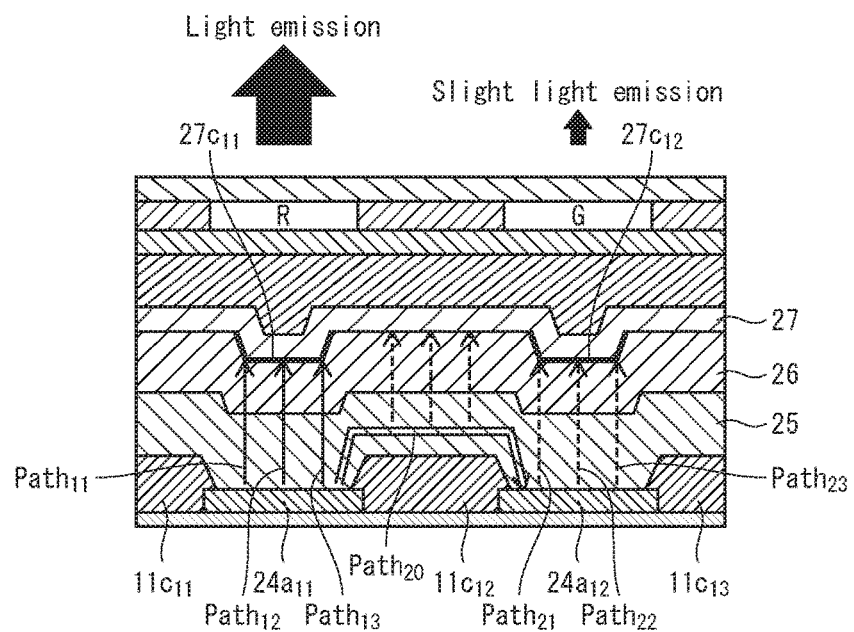
FIG. 15B illustrates electric paths ($Path_{11}$, $Path_{12}$, and $Path_{13}$) that extend straight from a pixel electrode $24a_{11}$ and a leak path $Path_{20}$ that extends along a surface of an electrically-insulating film.

In an organic EL display panel having such a structure, a strong electric field is generated in a vertical direction of the pixel electrodes $24a_{11}$ and $24a_{12}$. Holes from the pixel electrode $24a_{11}$ advance to the counter portion $27c_{11}$, and holes from the pixel electrode $24a_{12}$ advance to the counter portion $27c_{12}$, respectively. This causes currents to flow between the pixel electrode $24a_{11}$ and the counter portion $27c_{11}$, and between the pixel electrode $24a_{12}$ and the counter portion $27c_{12}$. Consequently, visible white light is emitted from portions of the white light-emitting layer in the high electric resistance layer 26 through which the currents have passed. Light of predetermined wavelengths in the visible white light passes through color filters, and light of red, green, and blue is generated. However, not all holes (currents) flowing from a pixel electrode necessarily arrive at the common electrode along the paths extending straight from the pixel electrode ($Path_{11}$, $Path_{12}$, $Path_{13}$ in FIG. 15B); there may be some holes (currents) that flow through another path ($Path_{20}$ in FIG. 15B; also referred to as a leak path) that extends along a surface of an electrically-insulating film and reaches an adjacent pixel electrode.

Because a leak path such as $Path_{20}$ that extends along a surface of an electrically-insulating film passes through the low electric resistance layer 25, holes (currents) typically flow through such a leak path easily. When many holes flow through $Path_{20}$ and reach an adjacent pixel electrode, the holes advance straight along $Path_{21}$, $Path_{22}$, $Path_{23}$ generated by an electric field of the adjacent pixel electrode $24a_{12}$. This causes an adjacent subpixel to emit a small amount of light. Meanwhile, a red color filter, a green color filter, and a blue color filter are disposed above the counter portion $27c_{11}$, the counter portion $27c_{12}$, and the counter portion $27c_{13}$, respectively, and light emitted from the white light-emitting layer causes light emission of the three primary colors red, green, and blue. However, when a great leak current amount advances along a surface of an electrically-insulating film ($Path_{20}$), arrives at the adjacent pixel electrode $24a_{12}$, and advances further toward the counter portion $27c_{12}$, light emission control that is intended to cause emission of red light causes slight emission of green light. Such slight light emission caused by a leak current gives rise to color unevenness and color mixture, and consequently causes image quality deterioration.

Japanese Patent Application Publication No. 2015-128065 discloses an organic EL display element in which an intermediate layer including at least one of a hole suppressing substance or an electron suppressing substance is interposed between a plurality of light-emitting layers. However, the intermediate layer disclosed in the above document is intended to suppress holes and/or electrons flowing through light-emitting layers, and does not have a function of preventing leak currents that start from one electrode and advance along a surface of an electrically-insulating film and toward a counter portion facing an adjacent pixel electrode.

<Aspects of Present Disclosure>

An organic EL display panel pertaining to one aspect of the present disclosure includes: a substrate; pixel electrodes that are arrayed in a matrix above the substrate; first organic functional layers that are on or above the pixel electrodes in one-to-one correspondence with the pixel electrodes, the first organic functional layers spaced apart from one another; a second organic functional layer that continuously covers the first organic functional layers; and a counter electrode that opposes the pixel electrodes and covers the second organic functional layer. In the organic EL display panel, the first organic functional layers each include a hole injection layer, and the second organic functional layer has greater electric resistance than each of the first organic functional layers and has a portion extending into an absence region, the absence region being a space between adjacent ones of the first organic functional layers. Occurrence of leak currents as described above is prevented in this organic EL display panel.

The second organic functional layer, which includes an organic EL element and has high electric resistance, continuously covers the first organic functional layers, which are on or above the pixel electrodes in one-to-one correspondence with the pixel electrodes. Accordingly, overall electric resistance in a path that starts from one pixel electrode, extends along a surface of an electrically-insulating film, and arrives at a light-emitting region of an adjacent subpixel is high. This structure achieves small leak current amounts, and only a negligible amount of light due to leak currents is emitted from the adjacent subpixel. Prevention of slight light emission caused by leak currents achieves organic EL display panels having high display quality.

The first organic functional layers, which are on or above the pixel electrodes in one-to-one correspondence with the pixel electrodes and are spaced apart from one another, can be made more specific as in the following. That is, in the organic EL display panel, each of the pixel electrodes may have an upper surface that is divided into a peripheral portion and a central portion, the peripheral portion covered by an electrically-insulating film, the first organic functional layers may be on or above the central portions of the pixel electrodes in one-to-one correspondence with the pixel electrodes, and side walls of the first organic functional layers may extend onto an upper surface of the electrically-insulating film.

The side walls of the first organic functional layers extend onto the upper surface of the electrically-insulating film and are in contact with the electrically-insulating film. Accordingly, the pixel electrodes are separated from each other by a portion of the second organic functional layer, which extends along the side walls and have high electric resistance, and the electrically-insulating film. This structure achieves electric blocking between the pixel electrodes, and consequently achieves thorough reduction of leak currents. This structure prevents light emission from undesired subpixels.

The second organic functional layer continuously covering the first organic functional layers can be expanded into specific aspects in the following. That is, in the organic EL display panel, the absence region may be defined by two opposing side walls of the adjacent ones of the first organic functional layers and a portion of the upper surface of the electrically-insulating film between the two opposing side walls.

A portion of the second organic functional layer that is present between the adjacent ones of the first organic functional layers covers two opposing side walls of the adjacent ones of the first organic functional layers. Accordingly, forming the second organic functional layer so as to uniformly cover the side walls and the portion of the upper surface of the electrically-insulating film achieves small leak current amounts.

Here, the organic EL display panel may include additional components. Specifically, the organic EL display panel may further include: a protection film that covers the counter electrode; and color filters that are above the protection film. In the organic EL display panel, the second organic functional layer may include an organic light-emitting layer, and each of the color filters may transmit light of a predetermined wavelength of visible light emitted from portions of the organic light-emitting layer above the first organic functional layers.

Each of the color filters is configured to transmit light of a predetermined wavelength of visible light emitted from portions of the organic light-emitting layer above the first organic functional layers. Accordingly, the subpixels of the three primary color red, green, and blue emit light of a desired hue. This structure enables the organic EL display panel pertaining to one aspect of the present disclosure to emit vivid colors.

Further, other components may be added. Specifically, the organic EL display panel may further include a light-shielding film. In the organic EL display panel, the light-shielding film may have a mask portion having a lattice structure, and the lattice structure of the mask portion may shield visible light emitted from the portion of the second organic functional layer extending into the absence region. The mask portion having a lattice structure and included in the light-shielding film shields visible light emitted from the portion of the second organic functional layer between the three-dimensional first organic functional layers. That is, this structure shields visible light emitted from the portion of the second organic functional layer in the absence region. This structure thus prevents quality deterioration of images caused by light emitted from the portion of the second organic functional layer that is present between the first organic functional layers, which are in one-to-one correspondence with the pixel electrodes.

The first organic functional layers, which are on or above the pixel electrodes in one-to-one correspondence with the pixel electrodes and are spaced apart from one another, can further be made more specific as in the following. Specifically, in the organic EL display panel, each of the first organic functional layers may be a laminate including the hole injection layer and a hole transport layer, the second organic functional layer may be a laminate including organic light-emitting layers, an electron transport layer, and an electron injection layer, and each of the organic light-emitting layers may extend into the absence region.

Also, in the organic EL display panel, each of the first organic functional layers may be a laminate including the hole injection layer, a hole transport layer, and a first organic light-emitting layer, the second organic functional layer may include a laminate including at least one second organic light-emitting layer, an electron transport layer, and an electron injection layer, and the at least one second organic light-emitting layer may extend into the absence region.

Further, in the organic EL display panel, each of the first organic functional layers may be a laminate including the hole injection layer, a hole transport layer, light-emitting layers, and an electron transport layer, the second organic functional layer may be composed of an electron injection layer, and the electron injection layer may extend into the absence region.

Components of the first organic functional layers and components of the second organic functional layer are changed in accordance with which of the hole transport layer, the organic light-emitting layers, the electron transport layer, and the electron injection layer have high electric resistance and which of these layers have low electric resistance. This structure enables the hole transport layer, the organic light-emitting layers, the electron transport layer, and the electron injection layer to be patterned into optimum shapes in accordance with electric resistance and thicknesses of these layers.

In the aspects described above, the first organic functional layers all include a hole injection layer. Alternately, the first organic functional layers may all include a hole transport layer. Specifically, an organic EL display panel pertaining to another aspect of the present disclosure includes: a substrate; pixel electrodes that are arrayed in a matrix above the substrate; first organic functional layers that are on or above the pixel electrodes in one-to-one correspondence with the pixel electrodes, the first organic functional layers spaced apart from one another; a second organic functional layer that continuously covers the first organic functional layers; and a counter electrode that opposes the pixel electrodes and covers the second organic functional layer. In the organic EL display panel, the first organic functional layers each include a hole transport layer, and the second organic functional layer has greater electric resistance than each of the first organic functional layers and has a portion extending into an absence region, the absence region being a space between adjacent ones of the first organic functional layers.

The organic EL display panel may further include a hole injection layer between the pixel electrodes and the first organic functional layers. In the organic EL display panel, the second organic functional layer may be a laminate including organic light-emitting layers, an electron transport layer, and an electron injection layer, and at least one of the organic light-emitting layers may extend into the absence region.

The organic EL display panel may further include a hole injection layer between the pixel electrodes and the first organic functional layer. In the organic EL display panel, each of the first organic functional layers may be a laminate including the hole transport layer, light-emitting layers, and an electron transport layer, the second organic functional layer may be composed of an electron injection layer, and the electron injection layer may extend into the absence region.

Components of the first organic functional layers and components of the second organic functional layer are changed in accordance with which of the hole injection layer, the organic light-emitting layers, the electron transport layer, and the electron injection layer have high electric resistance and which of these layers have low electric resistance. This structure enables the hole transport layer, the organic light-emitting layers, the electron transport layer, and the electron injection layer to be patterned into optimum shapes in accordance with electric resistance and thicknesses of these layers.

Embodiment 1

The following describes an organic EL display panel pertaining to one aspect of the present disclosure, with reference to the drawings.

[Circuit Structure of Organic EL Display Panel]

Figure 1A:
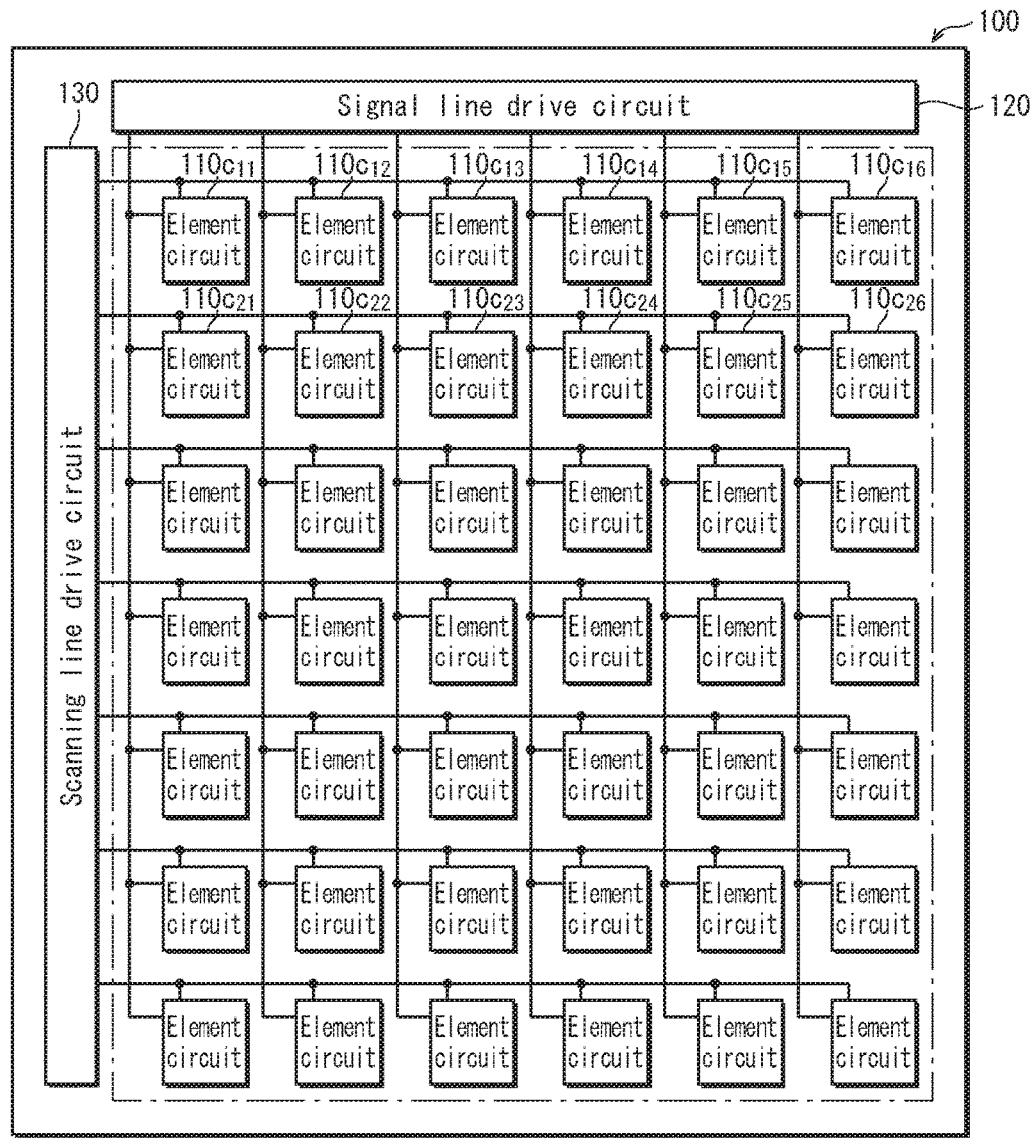
FIG. 1A illustrates a circuit structure of an organic EL display device including an organic EL display panel 100 pertaining to Embodiment 1.

First, description is given of a circuit structure of an organic EL display device including an organic EL display panel 100 pertaining to one aspect of the present disclosure, and further including drive circuits and a control circuit corresponding to the organic EL display panel. FIG. 1A illustrates a circuit structure of the organic EL device including the organic EL display panel 100 pertaining to Embodiment 1. As illustrated in FIG. 1A, the organic EL display device includes element circuits $110c_{11}$ through $110c_{16}$ and element circuits $110c_{21}$ through $110c_{26}$, a scanning line drive circuit 130, and a signal line drive circuit 120.

Figure 1B:
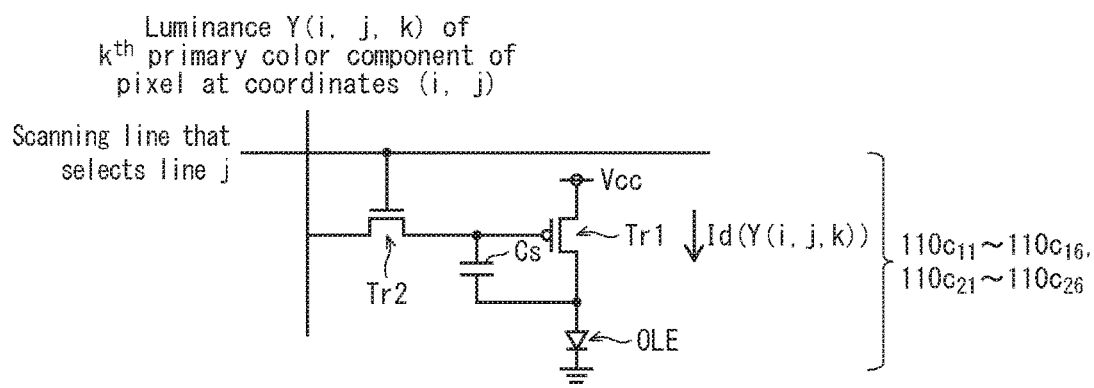
FIG. 1B illustrates a circuit structure that is common to element circuits $110c_{11}$ through $110c_{16}$ and element circuits $110c_{21}$ through $110c_{26}$.

The element circuits $110c_{11}$ through $110c_{16}$ and the element circuits $110c_{21}$ through $110c_{26}$ correspond one-to-one with subpixels that are arrayed in a matrix, and the element circuits $110c_{11}$ through $110c_{16}$ and the element circuits $110c_{21}$ through $110c_{26}$ have a common circuit structure as illustrated in FIG. 1B. Specifically, each of the element circuits $110c_{11}$ through $110c_{16}$ and the element circuits $110c_{21}$ through $110c_{26}$ includes an organic EL display element OLE and a drive circuit corresponding to the organic EL display element OLE. The drive circuit includes a drive transistor Tr1, a switching transistor Tr2, and a capacitor Cs.

In the present embodiment, the position of each pixel is specified by coordinates (i, j) which are a combination of a row number i and a column number j. A first primary color component is red, a second primary color component is blue, and a third primary color component is green. These primary color components are indicated by a variable k. The switching transistor Tr2 includes a gate electrode and a source electrode. The gate electrode receives a scanning line signal specifying a row number i, and the source electrode receives a signal Y(i, j, k) indicating luminance of a $k^{th}$ primary color component of a pixel located at coordinates (i, j).

The scanning line drive circuit 130 outputs a scanning line signal that selects one of a plurality of pixel lines constituting a frame image.

When a scanning line signal is output from the scanning line drive circuit 130, the signal line drive circuit 120 outputs line pixel signals to ones of the element circuits belonging to the selected one of the pixel lines. Line pixel signals indicate luminance values of the primary color components of the pixels (degrees of brightness of the primary color components of the pixels) in the selected pixel line, and supply the luminance values to the element circuits located at corresponding positions. This causes amplified currents Id(Y(i, j, k)) to flow in the drive transistors Tr1 of the element circuits. An amplified current Id(Y(i, j, k)) is in accordance with luminance Y(i, j, k) of a kth primary color component of a pixel located at the position indicated by coordinates (i, j).

[Plan View Structure of Organic EL Display Panel]

Figure 2:
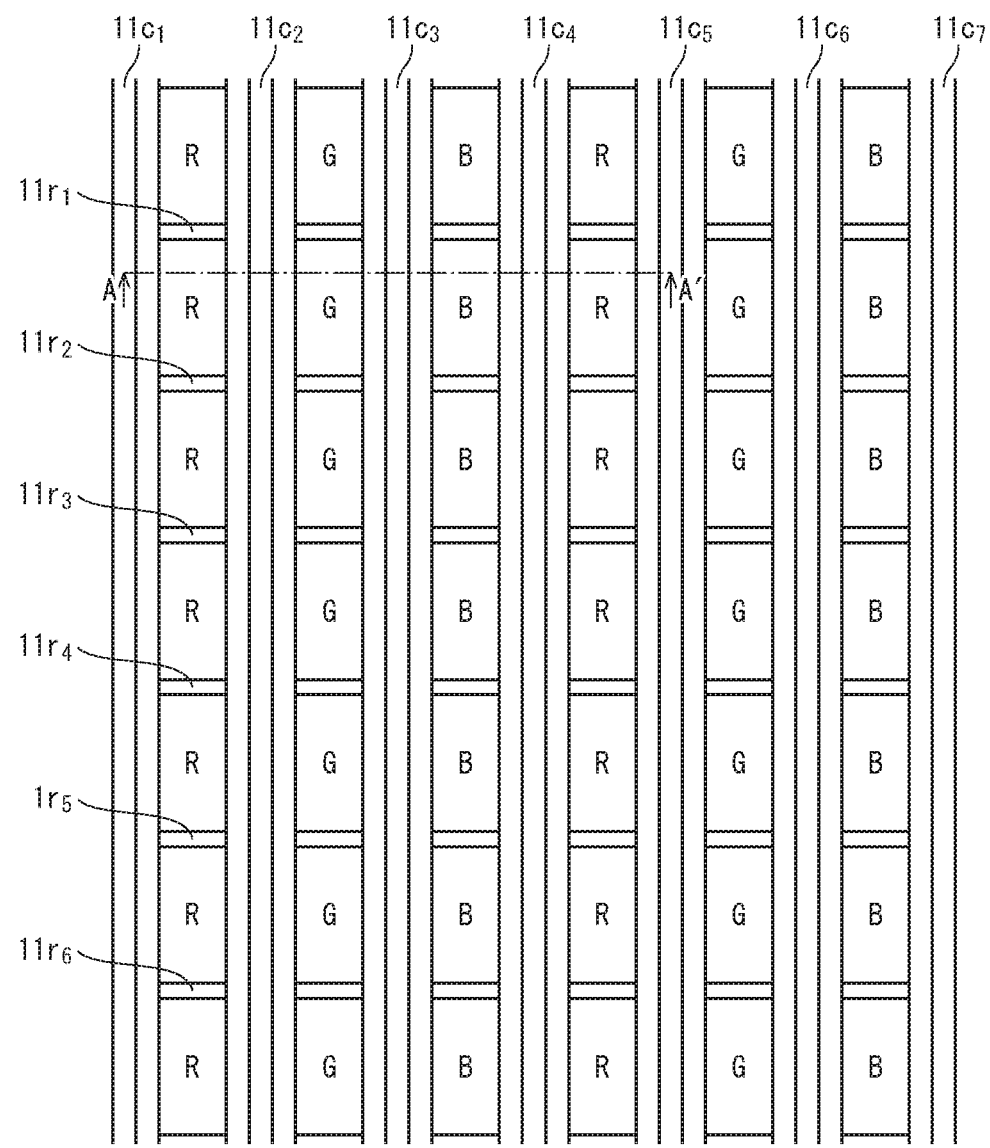
FIG. 2 illustrates a structure of a portion of a display region of an organic EL display panel 100 in plan view.

Next, a display region of the organic EL display panel 100 pertaining to Embodiment 1 is described. FIG. 2 illustrates a plan view structure of a portion of the display region of the organic EL display panel 100.

FIG. 2 shows that electrically-insulating films $11c_1$, $11c_2$, $11c_3$, $11c_4$, $11c_5$, $11c_6$, and $11c_7$ are arrayed in a column direction at the display surface of the organic EL display panel 100, and electrically-insulating films $11r_1$, $11r_2$, $11r_3$, $11r_4$, $11r_5$, $11r_6$ are arrayed in a row direction at the display surface of the organic EL display panel 100. These electrically-insulating films form a lattice structure (hereinafter referred to as windows). For example, these electrically-insulating films have a thickness from 100 nm to 200 nm, and are made of SiON.

The display region of the organic EL display panel 100 is divided into a plurality of subregions (regions R, regions G, and regions B in FIG. 2) by the lattice structure of the electrically-insulating films. The regions R, the regions G, and the regions B are light-emitting regions of red, green, and blue, respectively. Below each of the light-emitting regions, an organic EL display element and a drive circuit corresponding to the organic EL display element are disposed. Each of the light-emitting regions forms a subpixel, and a set of a region R, a region G, and a region B corresponds to a pixel. A plurality of sets of a region R, a region G, and a region B are arrayed in the row direction, i.e. a direction parallel to the short side of the display surface of the organic EL display panel 100. Meanwhile, a plurality of light-emitting regions emitting light of the same color are arranged in the column direction, i.e. a direction parallel to the long side of the display surface of the organic EL display panel 100.

[Cross-Sectional Structure of Organic EL Display Panel]

Figure 3:
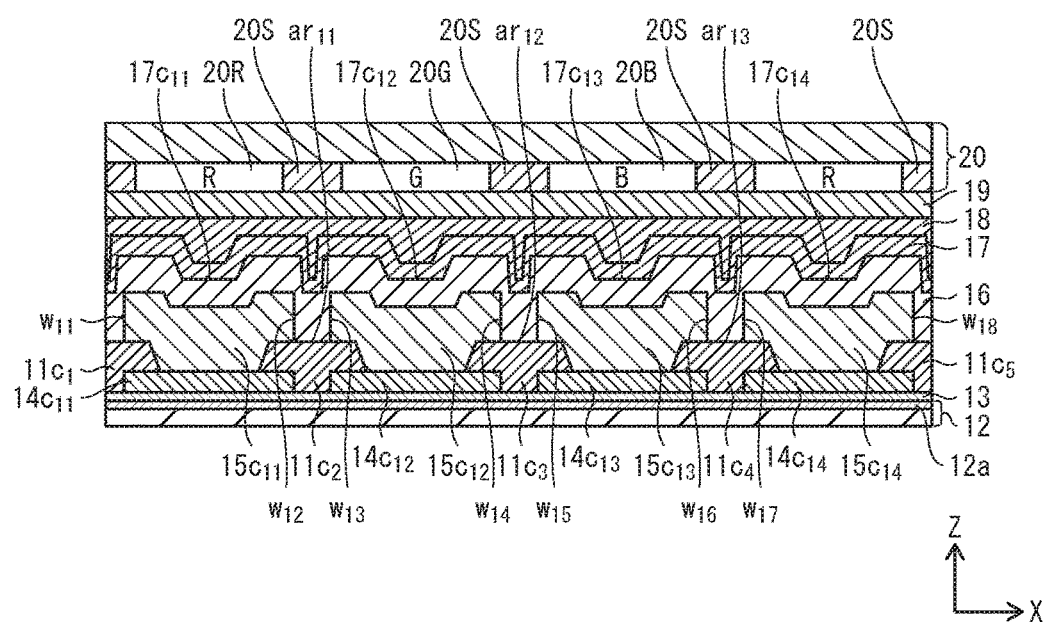
FIG. 3 illustrates a cross-sectional structure of the organic EL display panel 100, taken along dot and dash line A-A' in FIG. 2.

FIG. 3 illustrates a cross-sectional structure of the organic EL display panel 100 pertaining to Embodiment 1, taken along dot and dash line A-A' in FIG. 2. As illustrated in FIG. 3, the organic EL display panel 100 includes electrically-insulating films $11c_1$, $11c_2$, $11c_3$, $11c_4$, and $11c_5$, a substrate 12 (which includes a drive circuit layer 12a), an interlayer electrically-insulating layer 13, pixel electrodes $14c_{11}$, $14c_{12}$, $14c_{13}$, and $14c_{14}$, patterned bodies $15c_{11}$, $15c_{12}$, $15c_{13}$, and $15c_{14}$, a high electric resistance layer 16, a common electrode 17, a protection film 18, an adhesion layer 19, and a sealing substrate 20.

The substrate 12 includes the drive circuit layer 12a including drive circuit portions (that is, portions each formed by a drive transistor Tr1 and a switching transistor Tr2) of the element circuits $110c_{11}$ through $110c_{14}$.

The interlayer electrically-insulating layer 13 electrically insulates the substrate 12, which includes the drive circuit layer 12a, and covers unevenness of the surface of the substrate 12. For example, the interlayer electrically-insulating layer 13 has a thickness from 100 nm to 1000 nm, and is made of silicon oxynitride (SiON) or silicon oxide ($SiO_2$ or SiO).

The pixel electrodes $14c_{11}$ through $14c_{14}$ are in one-to-one correspondence with the subpixels. For example, the pixel electrodes $14c_{11}$ through $14c_{14}$ have a thickness about 100 nm, and are made of aluminum (Al) or an alloy containing aluminum (Al), which are highly reflective materials. Due to this structure, light generated in a white organic light-emitting layer is emitted outside from a common electrode side of the organic EL display panel 100. It is preferable that the thickness of the pixel electrodes $14c_{11}$ through $14c_{14}$ be such that the light generated in the white organic light-emitting layer does not pass through the pixel electrodes $14c_{11}$ through $14c_{14}$ and light emission efficiency is maintained, and for example, be from 30 nm to 200 nm. The pixel electrodes $14c_{11}$ through $14c_{14}$ are reflective electrodes made of aluminum (Al), an alloy of aluminum, a metal element such as gold (Au), platinum (Pt), nickel (Ni), chromium (Cr), copper (Cu), tungsten (W), molybdenum (Mo), titanium (Ti), tantalum (Ta), or silver (Ag), or alloys of these metals.

The pixel electrodes $14c_{11}$ through $14c_{14}$ may further include contact layers (not illustrated) below the above-described reflective electrodes. The contact layers have a thickness about 20 nm and are made of, for example, titanium (Ti), tungsten (W), copper (Cu), tantalum (Ta), or molybdenum (Mo). The contact layers also have a function as auxiliary reflection layers for maintaining high reflection ratio even when the pixel electrodes $14c_{11}$ through $14c_{14}$ have a small thickness. When such contact layers are present, the pixel electrodes $14c_{11}$ through $14c_{14}$ only need to have a thickness of 15 nm or greater.

Further, the pixel electrodes $14c_{11}$ through $14c_{14}$ may each have a laminate structure of three layers, namely: a titanium layer that is a contact layer and/or a auxiliary reflection layer; a reflective electrode made of a material such as aluminum or an alloy of aluminum described above; and a titanium layer or a tantalum layer. Alternatively, the pixel electrodes $14c_{11}$ through $14c_{14}$ each may be a composite film of the above-described reflective electrode and a light-transmissive electrode made of, for example, indium tin oxide (ITO), indium zinc oxide (IZO; a registered trademark), or $SnO_2$.

The patterned bodies $15c_{11}$, $15c_{12}$, $15c_{13}$, and $15c_{14}$ are first organic functional layers, and are disposed on the pixel electrodes $14c_{11}$ through $14c_{14}$, respectively, to cover exposed portions of the pixel electrodes $14c_{11}$ through $14c_{14}$. The patterned bodies $15c_{11}$ through $15c_{14}$ each have a laminate structure in which a hole transport layer (not illustrated) is on a hole injection layer (not illustrated), and have side walls $w_{11}$, $w_{12}$, $w_{13}$, $w_{14}$, $w_{15}$, $w_{16}$, $w_{12}$, and $w_{18}$ extending onto upper surfaces of the electrically-insulating films $11c_1$ through $11c_4$. The side walls $w_{11}$ through $w_{18}$ are formed through patterning a single low electric resistance material layer along the pixel electrodes. Regions defined by the side walls $w_{11}$ through $w_{18}$ and portions of the upper surfaces of the electrically-insulating films $11c_1$ through $11c_4$ are absence regions $ar_{11}$, $ar_{12}$, and $ar_{13}$ in which no first organic functional layer is present.

The high electric resistance layer 16 is a second organic functional layer, and covers upper surfaces of the patterned bodies $15c_{11}$ through $15c_{14}$. Portions of the high electric resistance layer 16 that do not cover the upper surfaces of the patterned bodies $15c_{11}$ through $15c_{14}$ extend into the absence region $ar_{11}$, which is between the side walls $w_{12}$ and $w_{13}$, the absence region $ar_{12}$, which is between the side walls $w_{14}$ and $w_{15}$, and the absence region $ar_{13}$, which is between the side walls $w_{16}$ through $w_{12}$. The high electric resistance layer 16, which is the second organic functional layer, has greater electric resistance than the first organic functional layers. Note that electric resistance in the present disclosure takes into consideration not only electric resistance of materials forming the layer or film but also film/layer thicknesses. Accordingly, a layer or film made of a material with high electric resistance may have low electric resistance when the layer or film has a small thickness. Similarly, a layer or film made of a material with low electric resistance may have high electric resistance when the layer or film has a great thickness. Thus, the high electric resistance layer 16 of the present disclosure has greater electric resistance in the above-described sense than the patterned bodies.

The common electrode 17 covers the high electric resistance layer 16. For example, the common electrode 17 is a laminate of a first layer, a second layer, and a third layer that are stacked in this order from a surface of the common electrode 17 facing the pixel electrodes $14c_{11}$ through $14c_{14}$. The first layer has a thickness about 0.3 nm and is made of lithium fluoride (LiF). The second layer has a thickness of 3 nm and is made of calcium (Ca). The third layer has a thickness of 5 nm and is made of Mg—Ag alloy. Further, the common electrode 17 has recessed counter portions $17c_{11}$, $17c_{12}$, $17c_{13}$, and $17c_{14}$. The counter portions $17c_{11}$, $17c_{12}$, $17c_{13}$, and $17c_{14}$ face the pixel electrodes $14c_{11}$, $14c_{12}$, $14c_{13}$, and $14c_{14}$, respectively.

The protection film 18 has a thickness from 0.5 μm to 10 μm, for example, is made of silicon nitride (SiN), and covers the common electrode 17.

The adhesion layer 19 is made of an ultraviolet cured resin or a thermosetting resin, for example, and adheres the protection film 18 and the sealing substrate 20 together. Further, the adhesion layer 19 has a function of covering recessed shapes of the high electric resistance layer 16 and the common electrode 17, which are formed due to the portions of the high electric resistance layer 16 filling spaces between adjacent ones of the patterned bodies.

The sealing substrate 20 includes transparent glass, for example, and seals the common electrode 17 and layers below the common electrode 17. The sealing substrate 20 includes red filters 20R, green filters 20G, blue filters 20B, and a light-shielding film 20S.

The red filters 20R extract light with a wavelength corresponding to red from visible white light emitted from the patterned bodies. Similarly, the green filters 20G extract light with a wavelength corresponding to green from visible white light emitted from the patterned bodies, and the blue filters 20B extract light with a wavelength corresponding to blue from visible white light emitted from the patterned bodies. The red filters 20R, the green filters 20G and the blue filters 20B are arranged so that each of the light-emitting regions of the subpixels corresponds to one of a red filter 20R, a green filter 20G, and a blue filter 20B. Further, the red filters 20R, the green filters 20G, and the blue filters 20B are arrayed in the order of a red filter 20R, a green filter 20G, and a blue filter 20B. The red filters 20R, the green filters 20G, and the blue filters 20B are made of a resin in which a pigment is mixed. The pigment is selected so as to achieve high transmittance of light having wavelength of the desired color (i.e. one of red, green, and blue) and low transmittance of light having wavelength of colors other than the desired color.

The light-shielding film 20S has a shadow mask covering non-light-emitting portions corresponding to the lattice structure of the electrically-insulating films. The absence regions $ar_{11}$, $ar_{12}$, $ar_{13}$ are respectively on the upper surfaces of the electrically-insulating films $11c_2$, $11c_3$, and $11c_4$, which form the lattice structure, and portions of the high electric resistance layer 16 extend into the absence regions $ar_{11}$, $ar_{12}$, $ar_{13}$. The shadow mask shields light emitted from the portions of the white organic light-emitting layer (not illustrated) in the high electric resistance layer 16 that are present between the patterned bodies. Accordingly, image quality does not deteriorate even when light is emitted from the portions of the white organic light-emitting layer between the patterned bodies. For example, the shadow mask is a black resin film in which a black colorant is mixed and has optical density of 1 or greater, or a thin-film filter making use of thin film interference. For example, the thin-film filter is a laminate of one or more thin films each made of a metal, a metal nitride, or a metal oxide, and attenuates light by making use of thin film interference. Specifically, a laminate formed by alternately stacking a film of chromium and a film of chromium (III) oxide ($Cr_2O_3$) may be used as the thin-film filter.

[Role of Electrically-Insulating Films $11c_1$, $11c_2$, $11c_3$, and $11c_4$ in Cross-Sectional Structure]

Next, a role of the electrically-insulating films $11c_1$, $11c_2$, $11c_3$, and $11c_4$ in the cross-sectional structure illustrated in FIG. 3 is described.

In the cross-sectional structure in FIG. 3, the electrically-insulating films $11c_1$, $11c_2$, $11c_3$, and $11c_4$ are arranged in parallel in the row direction on the interlayer electrically-insulating layer 13, which is disposed on the substrate 12. The electrically-insulating films $11c_1$, $11c_2$, $11c_3$, and $11c_4$ electrically insulate the pixel electrodes $14c_{11}$ through $14c_{14}$ from the common electrode 17 and provide the exposed portions of the pixel electrodes $14c_{11}$ through $14c_{14}$ with a desired shape. For example, the exposed portions of the pixel electrodes $14c_{11}$ through $14c_{14}$ are squares whose sides are about 10 μm, and the pixel electrodes $14c_{11}$ through $14c_{14}$ are spaced apart by a distance (inter-pixel electrode pitch) of about 3.3 μm.

This concludes description of the cross-sectional structure of the organic EL display panel 100.

[Laminate Structure of Patterned Bodies]

Figure 4:
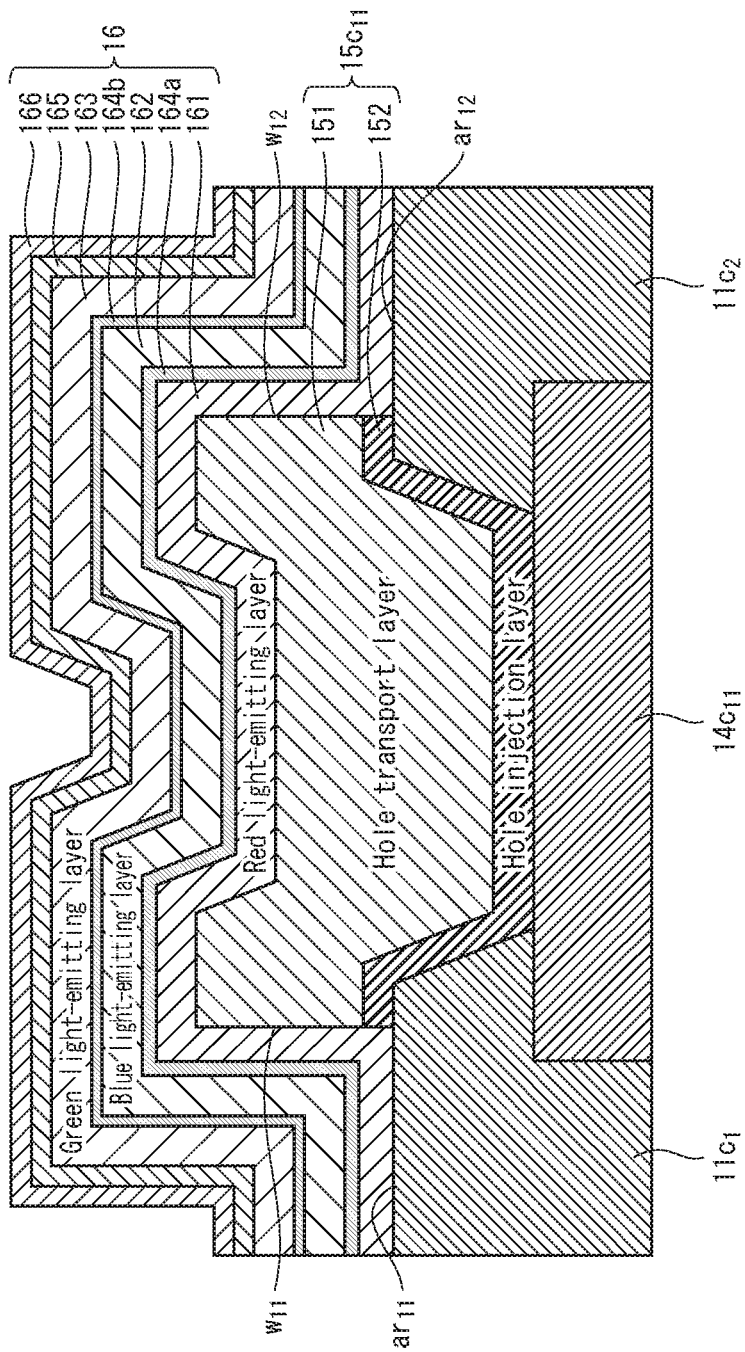
FIG. 4 illustrates a cross-sectional structure of a patterned body $15c_{11}$ and a high electric resistance layer 16.

The following describes a laminate structure of the patterned body $15c_{11}$ with reference to FIG. 4. FIG. 4 illustrates the laminate structure of the patterned body $15c_{11}$ and the laminate structure of the high electric resistance layer 16. The patterned bodies $15c_{11}$ through $15c_{14}$ have a common laminate structure made of a hole transport layer 151 and a hole injection layer 152, as illustrated in FIG. 4.

The hole injection layer 152 improves efficiency in injecting holes, and serves as a buffer layer for preventing current leakage. For example, the hole injection layer 152 has a thickness from 2 nm to 10 nm, and is made of hexatrilazatriphenylene shown in Chemical Formula 1.

[Chemical Formula 1]

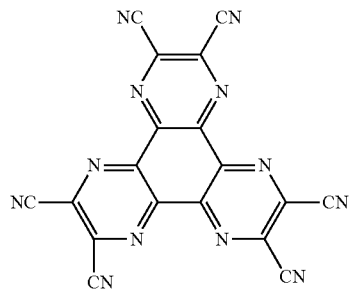

The hole transport layer 151 improves efficiency in injecting holes. For example, the hole transport layer 151 has a thickness of 30 nm, and is made of the material shown in Chemical Formula 2.

[Chemical Formula 2]

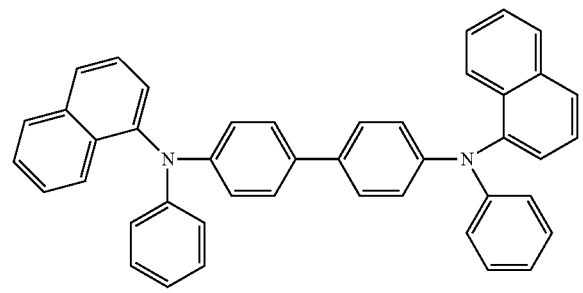

Because the hole injection layers 152 each have a thickness from 2 nm to 10 nm and the hole transport layers 151 each have a thickness of 30 nm, the patterned bodies $15c_{11}$ through $15c_{14}$ each have a thickness from 32 nm to 40 nm (from 30+2 nm to 30+10 nm).

[Laminate Structure of High Electric Resistance Layer 16]

Next, the laminate structure of the high electric resistance layer 16 is described. As illustrated in FIG. 4, the high electric resistance layer 16 includes a red (R) organic light-emitting layer 161, a blue (B) organic light-emitting layer 162, a green (G) organic light-emitting layer 163, separation layers 164 (a separation layer 164a and a separation layer 164b), an electron transport layer 165, and an electron injection layer 166.

The red organic light-emitting layer 161, the blue organic light-emitting layer 162, and the green organic light-emitting layer 163 each include a light-emitting material and at least one of a hole transport material, an electron transport material, and a hole and electron transport material. The red organic light-emitting layer 161, the blue organic light-emitting layer 162, and the green organic light-emitting layer 163 serve to recombine a portion of holes injected from the pixel electrodes $14c_{11}$ through $14c_{14}$ via the hole transport layer 151 and the hole injection layer 152 and a portion of electrons injected from the common electrode 17 via the electron transport layer 165 and the electron injection layer 166. This structure achieves emission of light of desired colors. Note that the light-emitting material may be a fluorescent material or a phosphorescent material.

Next, differences between the red organic light-emitting layer 161, the blue organic light-emitting layer 162, and the green organic light-emitting layer 163 are described. The red organic light-emitting layer 161, the blue organic light-emitting layer 162, and the green organic light-emitting layer 163 differ from one another in thicknesses and materials. Specifically, the red organic light-emitting layer 161 has a thickness of about 5 nm, for example, and is composed of a mixture obtained by mixing 30 wt % of 2,6-bis[(4'-methoxydiphenylamino) styryl]-1,5-dicyanonaphthalene (BSN) in 4,4'-Bis(2,2-diphenylvinyl)-1,1'-biphenyl (DPVBi).

The blue organic light-emitting layer 162 has a thickness of about 30 nm, for example, and is composed of a mixture obtained by mixing 2.5 wt % of 4,4'-bis[2-{4-(N,N-diphenylamino)phenyl}vinyl]biphenyl (DPAVBi) in DPVBi.

The green organic light-emitting layer 163 has a thickness of about 10 nm, for example, and is composed of a mixture obtained by mixing 5 wt % of coumarin 6 in DPVBi. Because the red organic light-emitting layer 161, the blue organic light-emitting layer 162, and the green organic light-emitting layer 163 are composed of materials as described above, the high electric resistance layer 16, which includes a laminate structure of these layers, has greater electric resistance than the patterned bodies $15c_{11}$ through $15c_{14}$, which are each a laminate of the hole injection layer 161 and the hole transport layer 162.

The separation layer 164a is disposed between the red organic light-emitting layer 161 and the blue organic light-emitting layer 162 and prevents holes and/or electrons from moving between the red organic light-emitting layer 161 and the blue organic light-emitting layer 162.

The separation layer 164b is disposed between the blue organic light-emitting layer 162 and the green organic light-emitting layer 163 and prevents holes and/or electrons from moving between the blue organic light-emitting layer 162 and the green organic light-emitting layer 163.

The separation layers 164a and 164b include either: (i) one of a hole suppressing substance or an electron suppressing substance, or (ii) a laminate in which a hole suppressing substance is disposed on an electron suppressing substance. When the separation layers 164a and 164b include an electron suppressing substance, the lowest unoccupied molecular orbital of the electron suppressing substance forming the separation layers 164a and 164b has a higher energy level than the lowest unoccupied molecular orbitals of the red organic light-emitting layer 161, the blue organic light-emitting layer 162, and the green organic light-emitting layer 163. Also, the highest occupied molecular orbital of the electron suppressing substance forming the separation layers 164a and 164b has a lower energy level than the highest occupied molecular orbitals of the red organic light-emitting layer 161, the blue organic light-emitting layer 162, and the green organic light-emitting layer 163. The energy level difference described above generates energy barriers that cause electrons transported by the electron transport layer 165 to concentrate at interlayer boundary surfaces between the separation layers and the organic light-emitting layers. For example, the material shown in Chemical Formula 3 may be used as the electron suppressing substance.

[Chemical Formula 3]

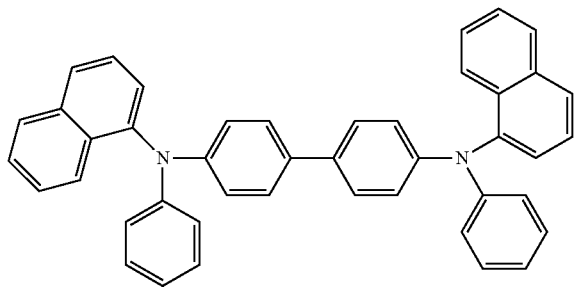

The electron transport layer 165 improves efficiency of injecting electrons into the red organic light-emitting layer 161, the blue organic light-emitting layer 162, and the green organic light-emitting layer 163. For example, the electron transport layer 165 has a thickness about 20 nm and is made of 8-hydroxyquinolinealuminum (Alq3).

The electron injection layer 166 performs injection of electrons supplied from the common electrode 17.

Because the red organic light-emitting layer 161 has a thickness about 5 nm, the blue organic light-emitting layer 162 has a thickness about 30 nm, and the green organic light-emitting layer 163 has a thickness about 10 nm, the separation layer 164 has a thickness of 10 nm, and the electron transport layer 165 has a thickness about 20 nm, the high electric resistance layer 16 has a thickness about 75 nm (=5 nm+30 nm+10 nm+10 nm+20 nm).

This concludes description of the laminate structure of the patterned bodies and the laminate structure of the high electric resistance layer 16.

[Positional Relationship Between Patterned Bodies $15c_{11}$ Through $15c_{14}$ and High Electric Resistance Layer 16]

Figure 5A:
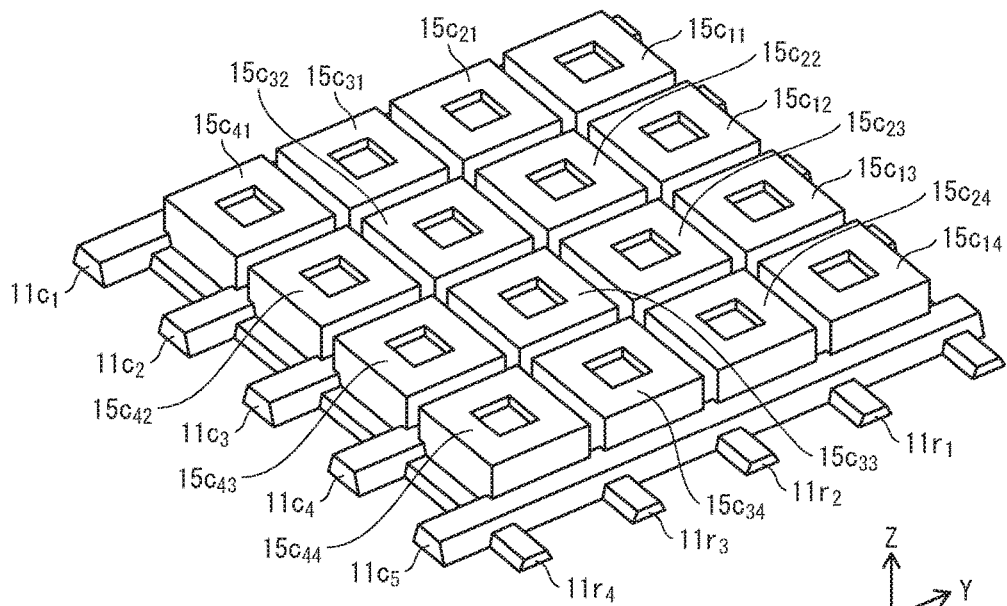
FIG. 5A is a perspective view illustrating three-dimensional shapes of patterned bodies $15c_{11}$ through $15c_{44}$ arrayed two-dimensionally above a substrate, seen from a position obliquely upward.

Because the positional relationship between the patterned bodies $15c_{11}$ through $15c_{14}$ and the high electric resistance layer 16 is essential, detailed description is given with reference to FIG. 5A, FIG. 5B, FIG. 6A, and FIG. 6B. FIG. 5A is a perspective view of three-dimensional shapes of a plurality of patterned bodies (patterned bodies $15c_{11}$ through $15c_{41}$, patterned bodies $15c_{12}$ through $15c_{42}$, patterned bodies $15c_{13}$ through $15c_{43}$, and patterned bodies $15c_{14}$ through $15c_{44}$) that are arranged two-dimensionally on the substrate 12, seen from a position obliquely upward. As illustrated in FIG. 5A, each of the patterned bodies has a shape of a prism and has a recess at an upper surface thereof.

Figure 5B:
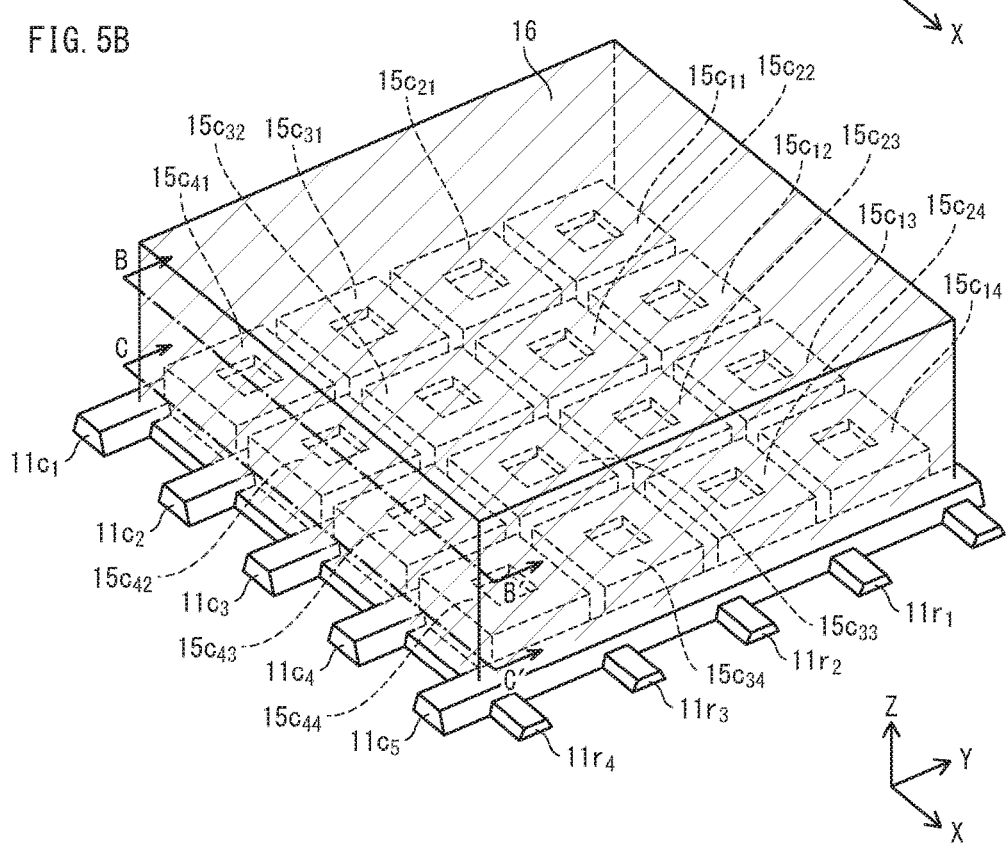
FIG. 5B illustrates a state in which the patterned bodies $15c_{11}$ through $15c_{44}$ and the high electric resistance layer 16 are combined through covering the patterned bodies $15c_{11}$ through $15c_{44}$ by the high electric resistance layer 16.
Figure 6A:
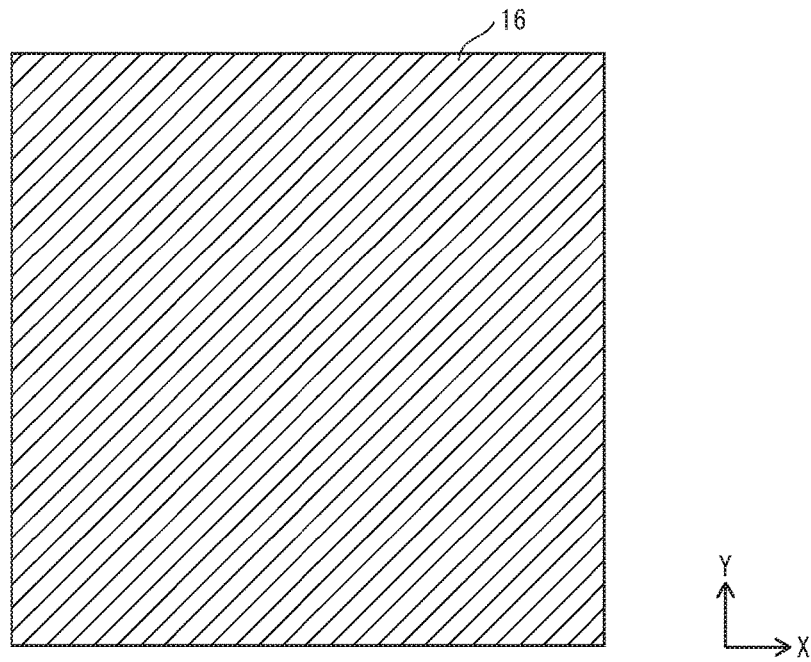
FIG. 6A illustrates a cross-sectional structure of a combined body taken along an X-Y plane located at dot and dash line B-B' in FIG. 5B.
Figure 6B:
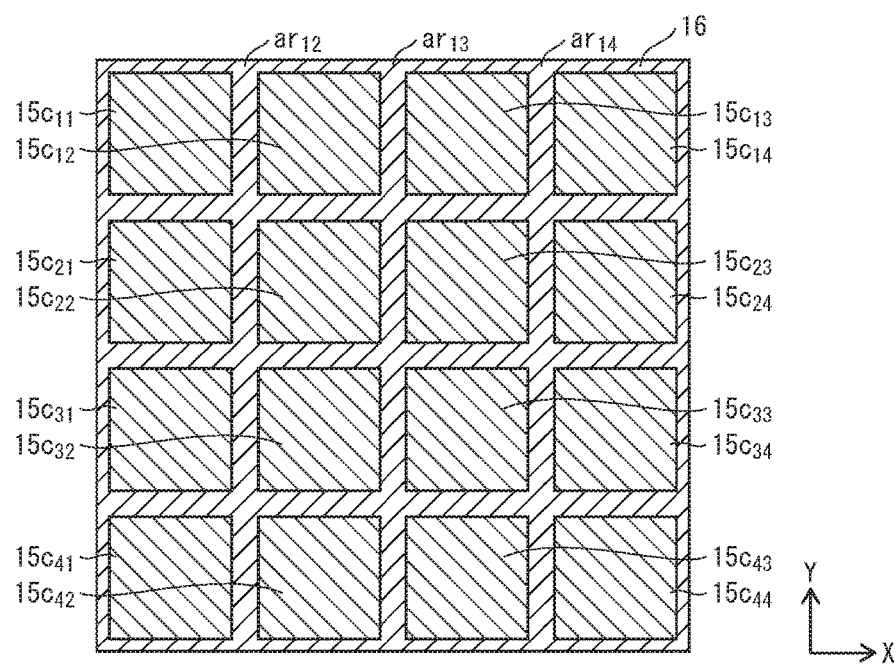
FIG. 6B illustrates a cross-sectional structure of the combined body taken along an X-Y plane located at dot and dash line C-C' in FIG. 5B.

FIG. 5B illustrates a state (a combined body) in which a patterned body group including the patterned bodies $15c_{11}$ through $15c_{14}$ is covered by the high electric resistance layer 16 and the patterned body group is combined with the high electric resistance layer 16. FIG. 6A illustrates a cross-sectional shape taken at a relatively high position of the combined body. FIG. 6B illustrates a cross-sectional shape taken at a relatively low position of the combined body. Specifically, FIG. 6A illustrates a cross-sectional structure of the combined body taken at an X-Y plane along dot and dash line B-B' in FIG. 5B, and FIG. 6B illustrates a cross-sectional structure of the combined body taken at an X-Y plane along dot and dash line C-C' in FIG. 5B. Comparison of the cross-sectional structure in FIG. 6A and the cross-sectional structure in FIG. 6B reveals that a material with high electric resistance forming the high electric resistance layer 16 occupies the entirety of the cross-section taken at a relatively high position in the organic EL display panel 100. Meanwhile, in the cross-section taken at a relatively low position in the organic EL display panel 100, cross-sectional shapes of the patterned bodies $15c_{11}$ through $15c_{44}$ are arrayed in a matrix, and portions of the high electric resistance layer 16 are present in the absence regions $ar_{11}$, $ar_{12}$, $ar_{13}$ between adjacent ones of the patterned bodies $15c_{11}$ through $15c_{14}$.

[Advantages of Positional Relationship]

Figure 7A:
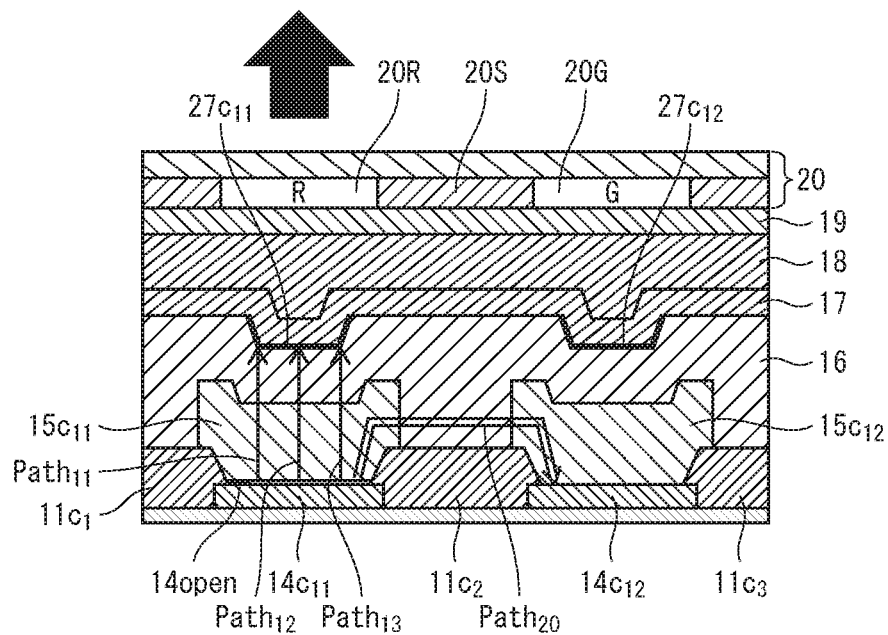
FIG. 7A illustrates electric field paths ($Path_{11}$, $Path_{12}$, and $Path_{13}$) that extend straight from a pixel electrode $14c_{11}$ and a path $Path_{20}$ that extends along a surface of an electrically-insulating film.

The following describes advantages of the above-described positional relationship of the patterned bodies $15c_{11}$ through $15c_{44}$ and the high electric resistance layer 16, by comparing the cross-sectional structure of the organic EL display panel 100 illustrated in FIG. 7A and the cross-sectional structure of the organic EL display panel illustrated in FIG. 15A. In the organic EL display panel having the cross-sectional structure illustrated in FIG. 15A, a low electric resistance layer continuously covers upper surfaces of a plurality of pixel electrodes. Meanwhile, in the organic EL display panel 100 having the cross-sectional structure as illustrated in FIG. 7A, a plurality of patterned bodies $15c_{11}$ through $15c_{44}$ that respectively overlap with the pixel electrodes $14c_{11}$ through $14c_{44}$ are low electric resistance layers.

Figure 7B:
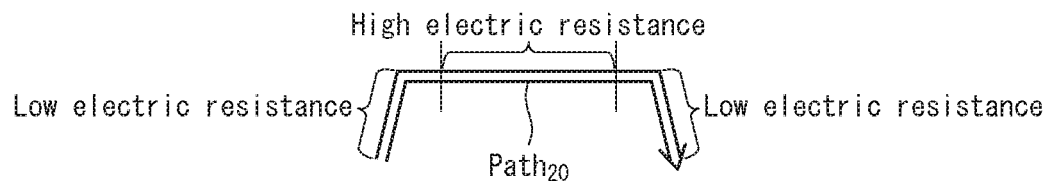
FIG. 7B illustrates ratios of portions of the path $Path_{20}$ through a material with low electric resistance and a portion of the path $Path_{20}$ through a material with high electric resistance.

The following considers electric resistance of a path that starts from a pixel electrode, extends along a surface of an electrically-insulating film, and arrives at an adjacent pixel electrode. Path$_{20}$ in FIG. 7A illustrates a leak path that starts from the pixel electrode $14c_{11}$, extends along a surface of the electrically-insulating film $11c_2$, and arrives at the pixel electrode $14c_{12}$. In the structure illustrated in FIG. 7A, a portion of the high electric resistance layer 16 is present between adjacent ones of the patterned bodies. Accordingly, a portion of Path$_{20}$ through a material with high electric resistance is longer than portions of Path$_{20}$ through a material with low electric resistance. In other words, a material with high electric resistance occupies a greater ratio in Path$_{20}$ than a material with low electric resistance (see FIG. 7B). Accordingly, only a small current amount flows from one pixel electrode, along the electrically-insulating film, to an adjacent pixel electrode, and eventually to the common electrode. This reduces or prevents slight light emission from the pixel corresponding to the adjacent pixel electrode, which may cause color unevenness and/or color mixture.

Meanwhile, there is a possibility that a small amount of light is emitted from regions between adjacent ones of the patterned bodies because portions of the organic light-emitting layers included in the high electric resistance layer 16 are present in the absence regions $ar_{11}$, $ar_{12}$, and $ar_{13}$. However, the light-shielding films 20S have shadow masks that are above the regions between the patterned bodies and that shield light from the regions between the patterned bodies. This structure prevents image quality of the organic EL display panel 100 from being affected by the light emitted from between the patterned bodies.

That is, high electric resistance of the path that starts from a pixel electrode, extends along a surface of an electrically-insulating film, and arrives at an adjacent pixel electrode achieves a small leak current. Further, the shadow mask shields light emitted from between the patterned bodies. Accordingly, the organic EL display panel 100 pertaining to the present embodiment achieves improved overall image quality.

[Where Patterned Bodies are Disposed]

The following describes where the patterned bodies are disposed.

As illustrated in FIG. 7A, the patterned body $15c_{11}$ is disposed on an exposed portion 14*open*. The exposed portion 14*open* is a portion of the pixel electrode $14c_{11}$ that is not covered by the electrically-insulating films $11c_1$ and $11c_2$. Because the patterned body $15c_{11}$ is disposed on the exposed portion 14*open* of the pixel electrode $14c_{11}$, an electric field between the pixel electrode $14c_{11}$ and the common electrode 17 is maximized.

Figure 7C:
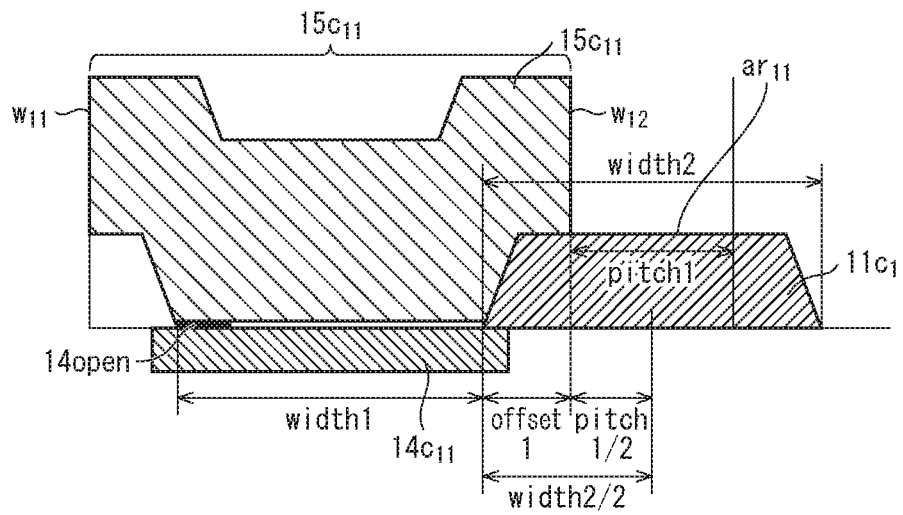
FIG. 7C illustrates width1 of an exposed portion $14open$ of the pixel electrode $14c_{11}$, and offset1.

The following describes a width of the patterned bodies in the row direction. As illustrated in FIG. 7C, a width of the patterned body $15c_{11}$ in the row direction from the side wall $w_{11}$ to the side wall $w_{12}$ is set to a value which is equal to or greater than width1 of the exposed portion 14*open* of the pixel electrode $14c_{11}$ and is smaller than a sum of width1 and two offset1 (width1+(offset1)*2)). Here, offset1 is half a value obtained by subtracting pitch1 from width2 of the electrically-insulating film $11c_1$ ((width2−pitch1)/2). Pitch1 is a minimal distance between the patterned bodies that is possible in manufacturing an organic EL display panel.

In order to minimize leak currents, the patterned bodies need to have the same width as the exposed portions 14*open* of the pixel electrodes. Meanwhile, when inserting of small portions of the high electric resistance layer 16, which is made of a material having high electric resistance, between the patterning bodies is expected to achieve prevention of leak currents, the width of the patterned bodies should be set as wide as possible (i.e. a sum of width1 of the exposed portions and two offset1 (width1+(offset1)*2)).

This concludes description of the organic EL display panel 100.

[Method of Manufacturing Organic EL Display Panel]

Figure 8:
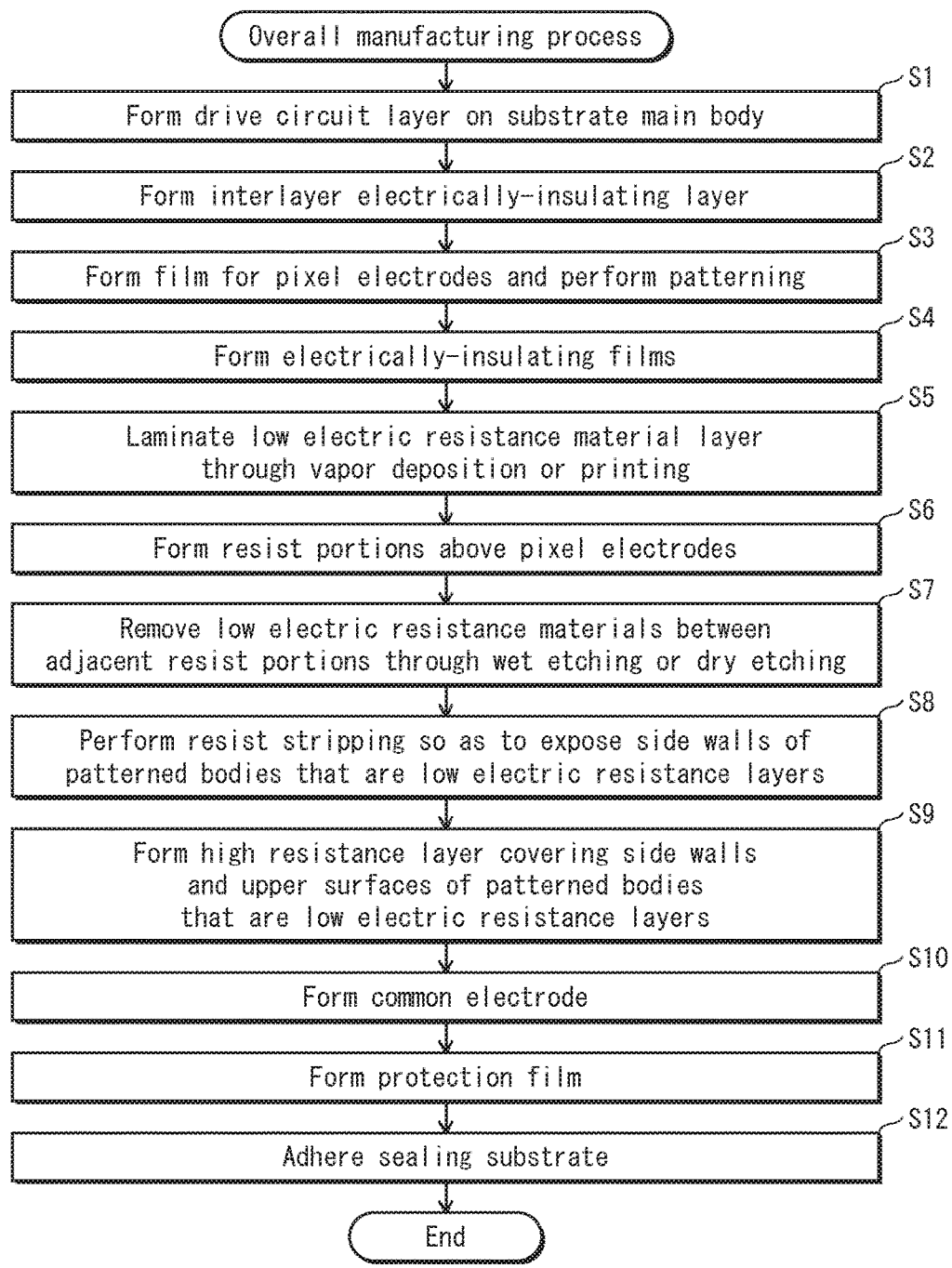
FIG. 8 is a flowchart illustrating an organic EL display panel manufacturing method.

The following describes an organic EL display panel manufacturing method pertaining to one aspect of the present disclosure. FIG. 8 is a flowchart illustrating a method of manufacturing the organic EL display panel 100. FIG. 9A through FIG. 9F illustrate how the organic EL display panel 100 is formed through the steps of the flowchart in FIG. 8. First, a drive circuit layer 12*a* is formed on a main body of the substrate 12 (S1), and the interlayer electrically-insulating layer 13 is formed (S2). Then, a film for forming the pixel electrodes $14c_{11}$ through $14c_{14}$ is formed, and the pixel electrodes $14c_{11}$ through $14c_{14}$ are formed through patterning (S3). These processes form the pixel electrodes $14c_{11}$ through $14c_{14}$ above the substrate 12, which includes the drive circuit layer 12*a*. Next, electrically-insulating films $11c_1$ through $11c_5$ partitioning the pixel electrodes $14c_{11}$ through $14c_{14}$ are formed above the substrate 12, on which the pixel electrodes $14c_{11}$ through $14c_{14}$ have been formed (S4). Then, a low electric resistance material layer 15 is laminated by performing vapor deposition or ink application to the substrate 12 on which layers up to the electrically-insulating films $11c_1$ through $11c_5$ have been formed (S5).

FIG. 9A illustrates a state after the low electric resistance material layer 15 has been laminated. The low electric resistance material layer 15 is a layer from which the patterned bodies $15c_{11}$ through $15c_{14}$ are formed.

Next, resist portions $30c_{11}$, $30c_{12}$, $30c_{13}$, and $30c_{14}$ are disposed on portions of the low electric resistance material layer 15 above the pixel electrodes $14c_{11}$, $14c_{12}$, $14c_{13}$, and $14c_{14}$, respectively (S6). As illustrated in FIG. 9B, the resist portions $30c_{11}$, $30c_{12}$, $30c_{13}$, and $30c_{14}$ are formed in one-to-one correspondence with the light-emitting regions. As illustrated in FIG. 9B, a resist portion facing an electrode and a resist portion facing an adjacent electrode have a gap therebetween.

Next, wet-etching or dry-etching is performed on portions of the low electric resistance material layer 15 between adjacent ones of the resist portions, and a low electric resistance material between adjacent ones of the resist portions is removed (S7). This forms the patterned body $15c_{11}$, which has the side walls $w_{11}$ and $w_{12}$, the patterned body $15c_{12}$, which has the side walls $w_{13}$ and $w_{14}$, the patterned body $15c_{13}$, which has the side walls $w_{15}$ and $w_{16}$, and the patterned body $15c_{14}$, which has the side walls $w_{12}$ and $w_{18}$. The side walls $w_{11}$ through $w_{18}$ extend along peripheral edges of the pixel electrodes as illustrated in FIG. 9C.

Next, resist stripping is performed, and the upper surfaces and the side walls $w_{11}$ through $w_{18}$ of the patterned bodies $15c_{11}$ through $15c_{14}$ are exposed as illustrated in FIG. 9D (S8).

Next, the high electric resistance layer 16 is formed through vapor deposition as illustrated in FIG. 9E, so that the high electric resistance layer 16 covers the side walls and the upper surfaces of the patterned bodies $15c_{11}$ through $15c_{14}$, which are low electric resistance layers (S9). Then, the common electrode 17 is formed through a thin-film process (S10), the protection film 18 is formed (S11), and the sealing substrate 20 is adhered (S12). These processes yield the layer structure illustrated in FIG. 9F.

[Summary]

As described above, the organic EL display panel 100 pertaining to Embodiment 1 prevents leak currents because portions of high electric resistance layer 16 are present between adjacent ones of the patterned bodies. Because the occurrence of leak current is prevented in such a manner, light emission control that is intended to cause a kth primary color component of a pixel at coordinates (i, j) to emit light is prevented from causing another primary color component (k−$1^{th}$ primary color component or k+$1^{th}$ primary color component) of the pixel at the coordinates (i, j) to emit light. Because each of the pixels can maintain its original color, high quality of displayed images is achieved.

Embodiment 2

In Embodiment 1, the patterned bodies, which are made of a low electric resistance material, are patterned by using a resist (S6 in FIG. 8). Meanwhile, in Embodiment 2, patterned bodies are formed through patterning processes other than resist patterning.

Figure 10:
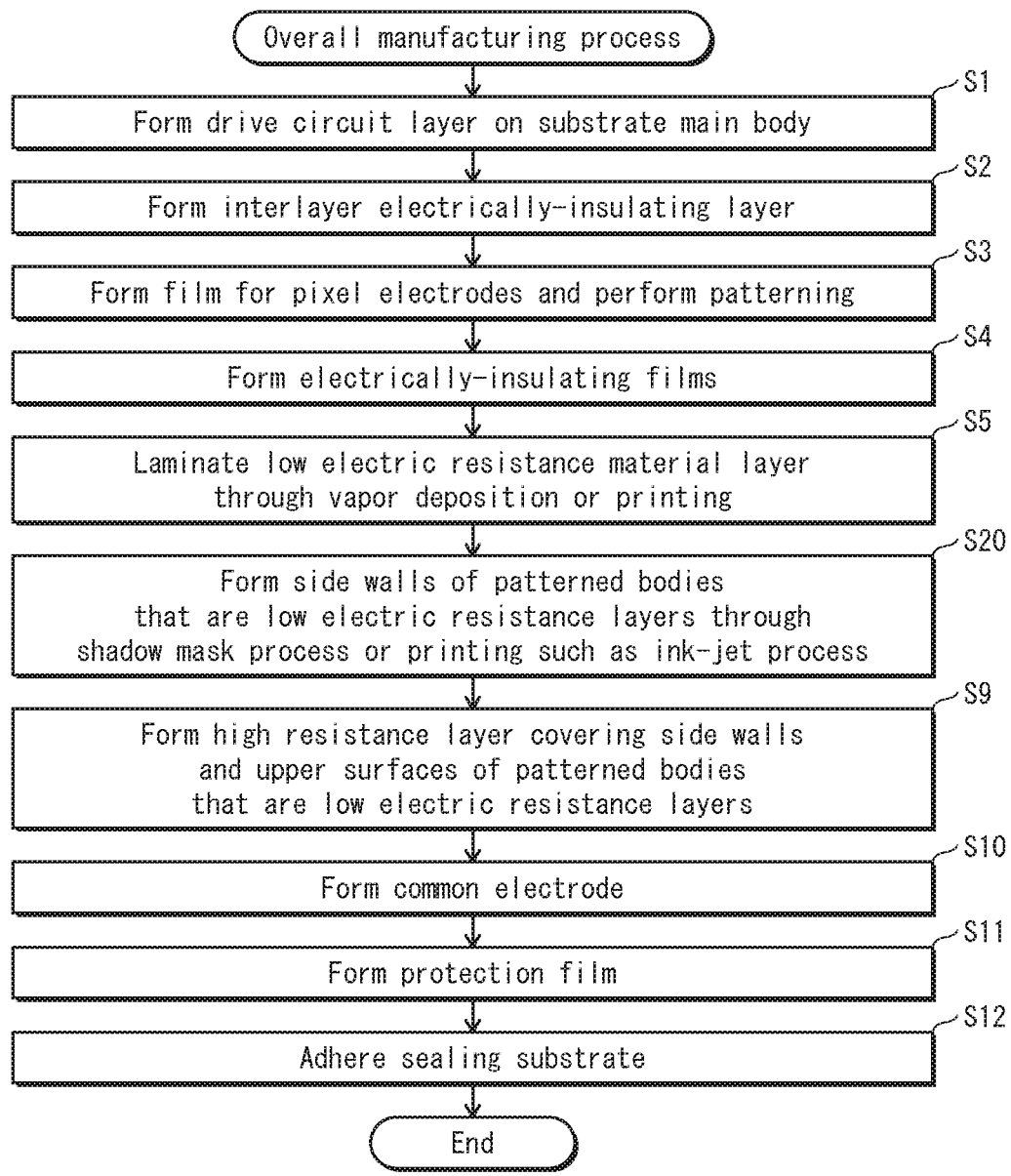
FIG. 10 is a flowchart illustrating an organic EL display panel manufacturing method pertaining to Embodiment 2.
Figure 11A:
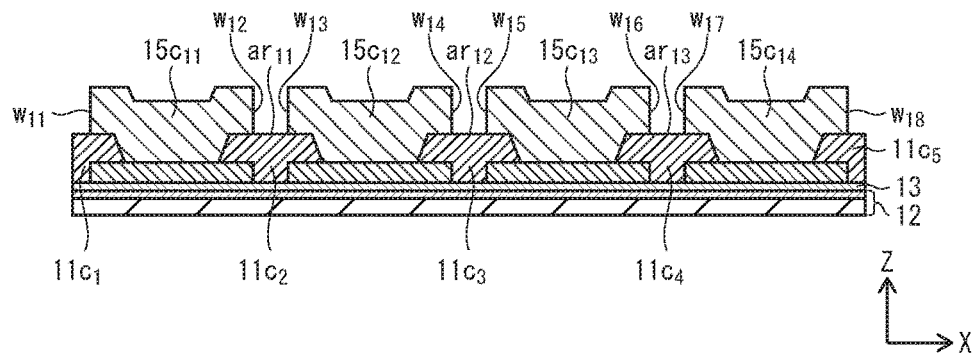
FIG. 11A through FIG. 11C illustrate how an organic EL display panel is formed through the steps of the flowchart in FIG. 10.
Figure 11B:
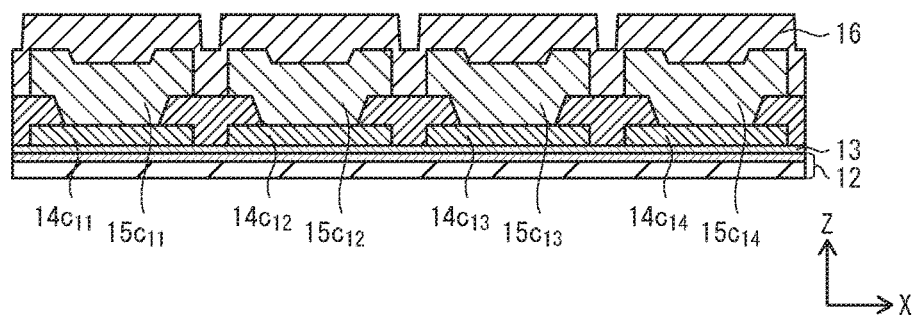
Figure 11C:
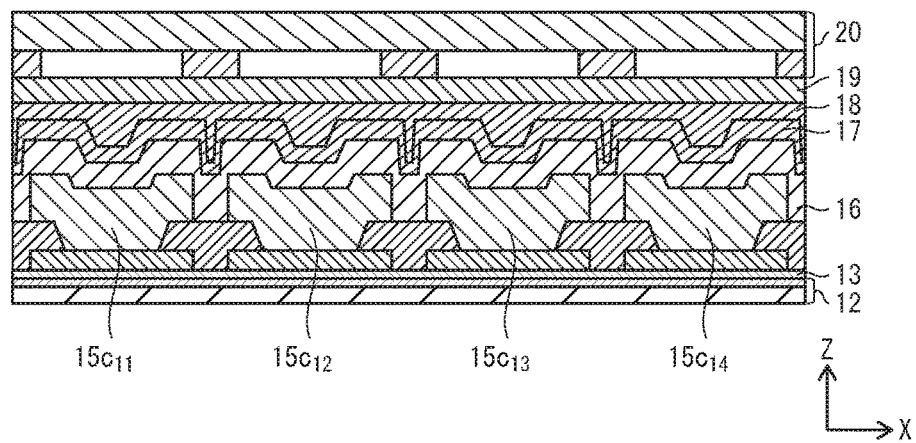

FIG. 10 is a flowchart illustrating an organic EL display panel manufacturing method pertaining to Embodiment 2. FIG. 11A through FIG. 11C illustrate how the organic EL display panel is formed through the steps of the flowchart in FIG. 10.

The organic EL display panel manufacturing method pertaining to Embodiment 2 differs from the method illustrated in FIG. 8 as in the following. As illustrated in FIG. 9B and FIG. 9C, in the patterning of the low electric resistance material layer 15, in which the resist portions $30c_{11}$ through $30c_{14}$ are used, the patterned bodies having side walls extending along peripheral edges of the pixel electrodes are formed through: forming of a low electric resistance material layer; forming of resist portions; and etching. Meanwhile, as illustrated in FIG. 10, in the process of patterning the low electric resistance layers through patterning processes other than the resist patterning, the low electric resistance layers are formed through printing such as an ink jet process or a shadow mask process (S20). Processes performed following this, that is, processes from forming of the high electric resistance layer 16 to adhesion of the sealing substrate 20 (S10 through S12), are similar to the method pertaining to Embodiment 1, in which resist patterning is performed.

The following describes advantages of resist patterning, printing such as an ink-jet process, and a shadow mask process. FIG. 12 is a table illustrating advantages of resist patterning, printing such as an ink-jet process, and a shadow mask process. As illustrated in FIG. 12, the resist patterning has an advantage of achieving a high definition.

The ink jet process has an advantage of achieving efficient use of materials and low cost. The shadow mask process has an advantage of reducing influence of impurities because forming is performed through a vacuum process.

Embodiment 3

In Embodiment 1, the first organic functional layers are each a laminate of a hole injection layer and a hole transport layer. However, electric resistance in the present disclosure does not refer to electric resistance of materials forming a layer, but refers to electric resistance of an entirety of a film/layer. Accordingly, there is a possibility that the hole transport layer, the organic light-emitting layers, and/or the electron transport layer have or has low electric resistance depending on thicknesses of these layers. In view of this, the present embodiment discloses an improvement in which the target of patterning is changed in accordance with which of the organic light-emitting layers, the hole transport layer, and/or the hole injection layer have or has low electric resistance.

In the present embodiment, the structure of the organic EL display panel are changed while presupposing four cases described below. Specifically, the following cases are considered: (i) a case where an organic light-emitting layer has low electric resistance (case 1), (ii) a case where any of the layers from the hole injection layer to the electron transport layer has low electric resistance (case 2), (iii) a case where the hole transport layer has low electric resistance and other layers, namely the hole injection layer, the organic light-emitting layers, the electron transport layer, and the electron injection layer have high electric resistance (case 3), and (iv) a case where the hole injection layer and the electron injection layer have high electric resistance and other layers, namely the hole transport layer, the organic light-emitting layers, and the electron transport layer have low electric resistance (case 4).

Figure 13A:
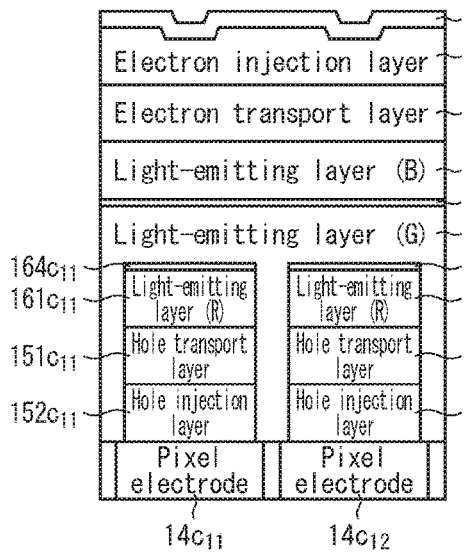
FIG. 13A illustrates an example of a structure in which first organic functional layers that are each a laminate including a hole injection layer, a hole transport layer, and a red organic light-emitting layer are disposed above the pixel electrodes $14c_{11}$ and $14c_{12}$ in one-to-one correspondence with the pixel electrodes $14c_{11}$ and $14c_{12}$.

FIG. 13A illustrates a specific example of case 1. Here, each of the first organic functional layers covers a corresponding one of a plurality of pixel electrodes (including pixel electrodes $14c_{11}$ and $14c_{12}$). The first organic functional layers are each a laminate including a hole injection layer, a hole transport layer, and a red organic light-emitting layer (a patterned body including a hole injection layer $152c_{11}$, a hole transport layer $151c_{11}$, a red organic light-emitting layer $161c_{11}$, and a separation layer $164c_{11}$; and a patterned body including a hole injection layer $152c_{12}$, a hole transport layer $151c_{12}$, a red organic light-emitting layer $161c_{12}$, and a separation layer $164c_{12}$). In case 1, a green organic light-emitting layer 163, a separation layer 164$b$, a blue organic light-emitting layer 162, an electron transport layer 165, and an electron injection layer 166 form the second organic functional layer. Among the layers forming the second organic functional layer, the green organic light-emitting layer 163 covers upper surfaces of the first organic functional layers, and extends into a space between the first organic functional layers.

Figure 13B:
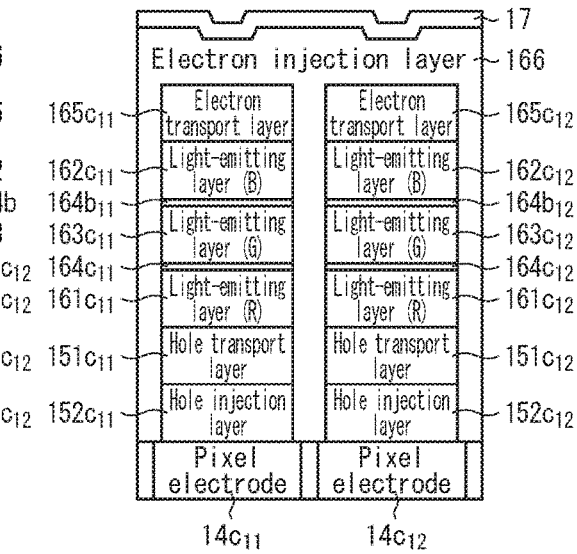
FIG. 13B illustrates an example of a structure in which first organic functional layers that are each a laminate including a hole injection layer, a hole transport layer, a red organic light-emitting layer, a green organic light-emitting layer, a blue organic light-emitting layer, and an electron transport layer are disposed above the pixel electrodes $14c_{11}$ and $14c_{12}$ in one-to-one correspondence with the pixel electrodes $14c_{11}$ and $14c_{12}$.

FIG. 13B illustrates a specific example of case 2. Here, each of a plurality of first organic functional layers covers a corresponding one of a plurality of pixel electrodes (including pixel electrodes $14c_{11}$ and $14c_{12}$). The first organic functional layers are each a laminate of a hole injection layer, a hole transport layer, a red organic light-emitting layer, a green organic light-emitting layer, a blue organic light-emitting layer, and an electron injection layer (a patterned body including a hole injection layer $152c_{11}$, a hole transport layer $151c_{11}$, a red organic light-emitting layer $161c_{11}$, a separation layer $164c_{11}$, a green organic light-emitting layer $163c_{11}$, a separation layer $164b_{11}$, a blue organic light-emitting layer $162c_{11}$, and an electron transport layer $165c_{11}$; and a patterned body including a hole injection layer $152c_{12}$, a hole transport layer $151c_{12}$, a red organic light-emitting layer $161c_{12}$, a separation layer $164c_{12}$, a green organic light-emitting layer $163c_{12}$, a separation layer $164b_{12}$, a blue organic light-emitting layer $162c_{12}$, and an electron transport layer $165c_{12}$). In case 2, only the electron injection layer 166 forms the second organic functional layer, which covers upper surfaces of the first organic functional layers and extends into a space between the first organic functional layers.

Figure 13C:
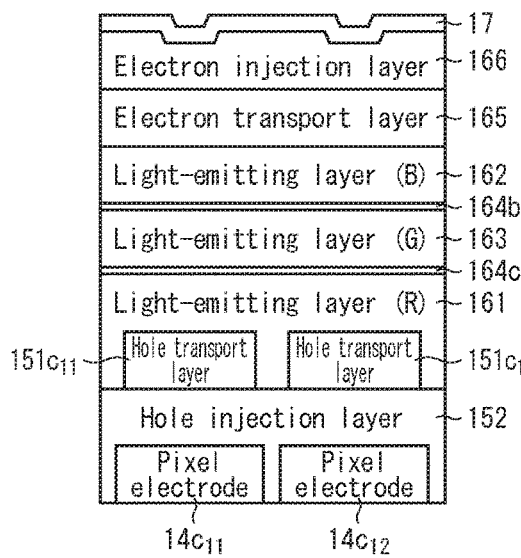
FIG. 13C illustrates an example of a structure in which the pixel electrodes $14c_{11}$ and $14c_{12}$ are covered by a single hole injection layer 152 and first organic functional layers that are each composed of a hole transport layer are disposed on portions of the single hole injection layer 152 above the pixel electrodes.

FIG. 13C illustrates a specific example of case 3. This is an example of a structure where pixel electrodes (including pixel electrodes $14c_{11}$ and $14c_{12}$) are covered by a single hole injection layer 152 and the first organic functional layers are each composed of a hole transport layer (a patterned body composed of a hole transport layer $151c_{11}$ and a patterned body composed of a hole transport layer $151c_{12}$) and are disposed on portions of the single hole injection layer 152 that are above the pixel electrodes. In case 3, a red organic light-emitting layer 161, a separation layer 164$c$, a green organic light-emitting layer 163, a separation layer 164$b$, a blue organic light-emitting layer 162, an electron transport layer 165, and an electron injection layer 166 form the second organic functional layer, and the red organic light-emitting layer 161 covers upper surfaces of the first organic functional layers and extends into a space between the first organic functional layers.

Figure 13D:
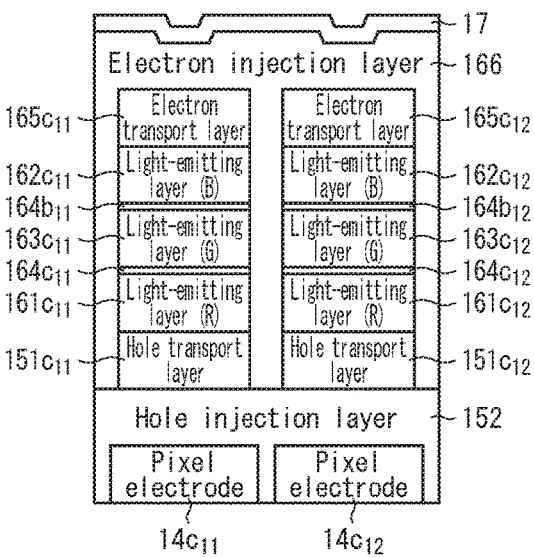
FIG. 13D illustrates an example of a structure in which the pixel electrodes $14c_{11}$ and $14c_{12}$ are covered by a single hole injection layer 152, and first organic functional layers each include a hole transport layer, a red organic light-emitting layer, a green organic light-emitting layer, a blue organic light-emitting layer, and an electron transport layer and are disposed on portions of the hole injection layer 152 above the pixel electrodes.

FIG. 13D illustrates a specific example of case 4. Here, pixel electrodes (including pixel electrodes $14c_{11}$ and $14c_{12}$) are covered by a single hole injection layer 152, and the first organic functional layers each include a hole transport layer, a red organic light-emitting layer, a green organic light-emitting layer, a blue organic light-emitting layer, and an electron transport layer (a patterned body including a hole transport layer $151c_{11}$, a red organic light-emitting layer $161c_{11}$, a separation layer $164c_{11}$, a green organic light-emitting layer $163c_{11}$, a separation layer $164b_{11}$, a blue organic light-emitting layer $162c_{11}$, and an electron transport layer $165c_{11}$; and a patterned body including a hole transport layer $151c_{12}$, a red organic light-emitting layer $161c_{12}$, a green organic light-emitting layer $163c_{12}$, a separation layer $164c_{12}$, a blue organic light-emitting layer $162c_{12}$, a separation layer $164b_{12}$, and an electron transport layer $165c_{12}$) and are disposed on the single hole injection layer 152. In case 4, the second organic functional layer is composed of an electron injection layer 166, covers upper surfaces of the first organic functional layers, and extends into a space between the first organic functional layers.

Embodiment 4

In Embodiment 1 and Embodiment 3, emission of white light is achieved by a laminate including a red organic light-emitting layer, a green organic light-emitting layer, and a blue organic light-emitting layer. Meanwhile, in the present embodiment, emission of white light is achieved by a laminate including a yellow organic light-emitting layer and a blue organic light-emitting layer. FIG. 14A through FIG. 14E illustrate examples of an organic EL display panel employing a yellow organic light-emitting layer and a blue organic light-emitting layer.

Figure 14A:
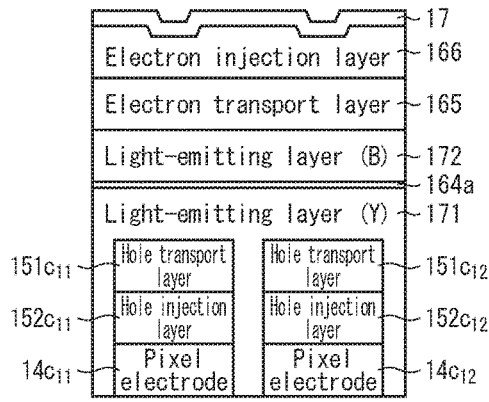
FIG. 14A illustrates an example of a structure in which a white organic EL display element is a laminate including a yellow organic light-emitting layer 171 and a blue organic light-emitting layer 172.

FIG. 14A illustrates an example of a structure corresponding to the structure described in Embodiment 1. Here, a laminate of a yellow organic light-emitting layer 171, a separation layer 164$a$, and a blue organic light-emitting layer 172 forms a part of the second organic functional layer.

Figure 14B:
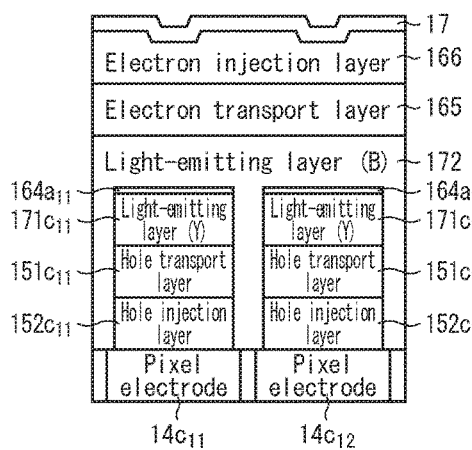
FIG. 14B illustrates an example of a structure in which each of a plurality of first organic functional layers includes a yellow organic light-emitting layer (yellow organic light-emitting layer $171c_{11}$ or a yellow organic light-emitting layer $171c_{12}$), and a blue organic light-emitting layer 172 forms a part of a second organic functional layer.

FIG. 14B illustrates an example of a structure corresponding to the structure of case 1 in Embodiment 3. Here, each of the first organic functional layers includes a pair of a yellow organic light-emitting layer and a separation layer corresponding to the yellow organic light-emitting layer (a pair of a yellow organic light-emitting layer $171c_{11}$ and a separation layer $164a_{11}$; and a pair of a yellow organic light-emitting layer $171c_{12}$ and a separation layer $164a_{12}$), and a blue organic light-emitting layer 172 forms a part of the second organic functional layer.

Figure 14C:
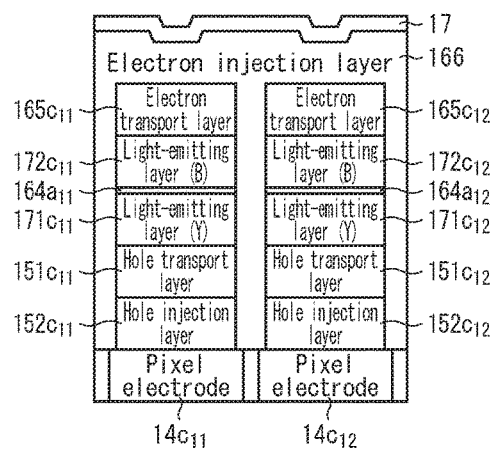
FIG. 14C illustrates an example of a structure in which each first organic functional layer includes a laminate including a yellow organic light-emitting layer and a blue organic light-emitting layer.

FIG. 14C illustrates an example of a structure corresponding to the structure of case 2 in Embodiment 3. Here, each of the first organic functional layers includes a laminate including a yellow organic light-emitting layer and a blue organic light-emitting layer (a laminate of a yellow organic light-emitting layer $171c_{11}$, a separation layer $164a_{11}$, and a blue organic light-emitting layer $172c_{11}$; and a laminate of a yellow organic light-emitting layer $171c_{12}$, a separation layer $164a_{12}$, and a blue organic light-emitting layer $172c_{12}$).

Figure 14D:
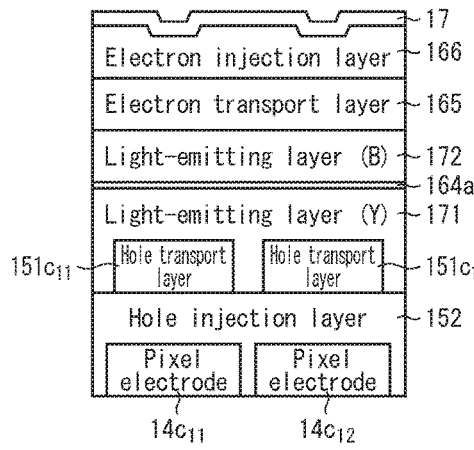
FIG. 14D illustrates an example of a structure in which a second organic functional layer includes a laminate including a yellow organic light-emitting layer 171 and a blue organic light-emitting layer 172.

FIG. 14D illustrates an example of a structure corresponding to the structure of case 3 in Embodiment 3. Here, the second organic functional layer includes a laminate of a yellow organic light-emitting layer 171, a separation layer 164$a$, and a blue organic light-emitting layer 172.

Figure 14E:
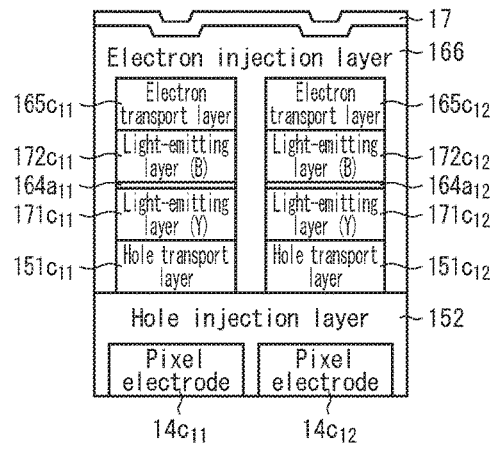
FIG. 14E illustrates an example of a structure in which each first organic functional layer includes a laminate including a yellow organic light-emitting layer and a blue organic light-emitting layer.

FIG. 14E illustrates an example of a structure corresponding to the structure of case 4 in Embodiment 3. Here, each of a plurality of first organic functional layers includes a laminate of a yellow organic light-emitting layer, a separation layer $164a_{11}$, and a blue organic light-emitting layer (a laminate of a yellow organic light-emitting layer $171c_{11}$, a separation layer $164a_{11}$, and a blue organic light-emitting layer $172c_{11}$; and a laminate of a yellow organic light-emitting layer $171c_{12}$, a separation layer $164a_{12}$, and a blue organic light-emitting layer $172c_{12}$).

<Other Modifications>

In the above, description is given of the organic EL display panel 100 pertaining to embodiments. However, it goes without saying that the organic EL display panel 100 can be modified as described in the following, and that the present disclosure should not be construed as being limited to the structures of the organic EL display panel 100 described in the above embodiments.

(1) In Embodiment 1, description is given on the basis of an organic EL display panel employing a white light-emitting layer as the light source. However, the present disclosure should not be construed as being limited to this. For example, in an organic EL display panel in which red organic light-emitting layers, green organic light-emitting layers, and blue organic light-emitting layers are patterned so that each of the subpixels include one of a red organic light-emitting layer, a green organic light-emitting layer, and a blue organic light-emitting layer, and in which a common hole injection layer and a common hole transport layer are provided, the low electric resistance layers may be patterned so that patterned bodies made from the low electric resistance material layer correspond one-to-one with the pixel electrodes. In this case, patterned bodies having side walls extending along the peripheral edges of the pixel electrodes are formed after forming the low electric resistance layers in S5 of FIG. 8, through one of resist patterning, an ink jet process, and a shadow mask process. Next, organic light-emitting layers of the primary colors red, green, and blue are formed so as to cover upper surfaces of the patterned bodies, which correspond one-to-one with the pixel electrodes. This prevents leak currents in an organic EL display panel in which organic light-emitting layers are patterned so as to correspond one-to-one with the subpixels and in which a common hole injection layer and a common hole transport layer are provided.

(2) It is desirable that the number of patterned bodies formed through patterning the low electric resistance material layer as described above be determined in accordance with resolution of the organic EL display panel. When the organic EL display panel that is to be manufactured is intended to display 2K full HD images, the number of patterned bodies in the row direction is 1920×3, and the number of patterned bodies in the column direction is 1080. When the organic EL display panel that is to be manufactured is intended to display 4K full HD images, the number of patterned bodies in the row direction is 3840×3, and the number of patterned bodies in the column direction is 2160. When the organic EL display panel that is to be manufactured is intended to display 8K full HD images, the number of patterned bodies in the row direction is 7680×3, and the number of patterned bodies in the column direction is 4320. Further, patterning of the low electric resistance material layer for forming the patterned bodies may not necessarily be performed for all subpixels in a frame image. The patterned bodies may be formed by performing patterning of the low electric resistance material layer above pixel electrodes that correspond to subpixels belonging to some lines forming a frame image or to pixel electrodes that correspond to subpixels belonging to a specific rectangular region (for example, a rectangular region formed by 64 pixels arrayed in the row direction and 64 pixels arrayed in the column direction, a rectangular region formed by 128 pixels arrayed in the row direction and 128 pixels arrayed in the column direction). Further, patterning of the low electric resistance layers may be performed for pixel electrodes corresponding to subpixels of one of the three primary colors red, green, and blue. Further, in the embodiments, the side walls $w_{11}$ through $w_{18}$ of the patterned bodies, which are the low electric resistance layers, erect straight on the electrically-insulating films $11c_1$ through $11c_4$. However, the side walls may erect diagonally.

(3) In Embodiment 1, the side walls of the patterned bodies extend along the peripheral edges of the pixel electrodes. However, the present disclosure should not be construed as being limited to this, and the patterned bodies in the present disclosure may have any shape as long as each of the patterned bodies has a portion above a corresponding one of the pixel electrodes. For example, the patterned bodies may be cylindrical.

(4) In the above embodiments, description is given of an example of a top-emission type display panel in which light generated in the light-emitting layers is emitted outside from a surface of the display panel close to the common electrode 17. However, the organic EL display panel of the present disclosure may be a bottom-emission type display panel in which light generated in the light-emitting layers is emitted from surfaces of the display panels close to the pixel electrodes $14c_{11}$ through $14c_{14}$. In this case, the pixel electrodes $14c_{11}$ through $14c_{14}$ are light-transmissive electrodes made of a material such as ITO, IZO (a registered trademark), or $SnO_2$, and the common electrode 17 is a reflective electrode made of a metal element such as gold (Au), platinum (Pt), nickel (Ni), chromium (Cr), copper (Cu), tungsten (W), aluminum (Al), molybdenum (Mo), or silver (Ag), or an alloy of one of these metals. Alternatively, the common electrode 17 may be a composite film including a reflective electrode and a light-transmissive electrode. Further, when the organic EL display panel is a bottom-emission type display panel, the color filters 20 and the light-shielding film 20S may be disposed, for example, between the drive circuit layer 12a of the substrate 12 and the interlayer electrically-insulating layer 13.

Further, for example, materials and thicknesses of the layers described in the above embodiments, and how and under what conditions the layers are made should not be construed as being limited to the ones described above. The layers may be formed by other materials, have different thicknesses, and/or be formed through different methods and/or under different conditions.

(5) In the above-described embodiments, the pixel electrodes, which are anodes, are disposed close to the substrate 12, which includes the drive circuit layer 12a, and the counter electrode, which is a cathode, is disposed away from the substrate 12. However, the present disclosure should not be construed as being limited to this. The organic EL display panel may also have a structure in which the cathode is disposed close to the substrate 12, which includes the drive circuit layer 12a, and the anodes are disposed away from the substrate 12.

<<Supplements>>

The embodiments described above are each a specific example of a preferred embodiment of the present disclosure.

The values, shapes, materials, component elements, positions and connections of the component elements, processes, ordering of processes, etc., are only examples and are not intended to limit the scope of the present disclosure. Further, among the component elements of the embodiments, processes not recited in the independent claims that indicate highest level concepts of the present disclosure are described as optional elements to improve on the highest level concepts. Further, in order to aid understanding of the present disclosure, the dimensions of the elements illustrated in the drawings for the embodiments may differ from actual dimensions. Further, the present disclosure is not intended to be limited in scope by the embodiments, and can be appropriately modified without departing from the scope of the present disclosure. Further, in the organic EL display panel are members such as circuit elements and lead lines on substrates, but description thereof is omitted, as various configurations are possible based on common knowledge in the technical fields of electrical wiring and circuitry, and such description is not directly relevant to the present disclosure. The drawings indicated above are schematic diagrams, and are not necessarily exact.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic EL display panel comprising:
   a substrate;
   a plurality of pixel electrodes that is arrayed in a matrix above the substrate;
   a plurality of first organic functional layers that is disposed above the pixel electrodes, each of the first organic functional layers overlapping each of the pixel electrodes in one-to-one correspondence, and each of the first organic functional layers being spaced apart from one another;
   an absence region disposed between adjacent ones of the first organic functional layers;
   a second organic functional layer that continuously covers the plurality of the first organic functional layers, and includes a portion that is disposed in the absence region and between the adjacent ones of the first organic functional layers; and
   a counter electrode disposed to face towards the pixel electrodes and covers a portion of the second organic functional layer,
   wherein
   each of the first organic functional layers includes a hole injection layer,
   the second organic functional layer has greater electric resistance than each of the first organic functional layers,
   each of the first organic functional layers is a laminate including the hole injection layer and a hole transport layer,
   the second organic functional layer is a laminate including organic light-emitting layers, an electron transport layer, and an electron injection layer, and
   each of the organic light-emitting layers includes a portion extending into the absence region.

2. An organic EL display panel comprising:
   a substrate;
   a plurality of pixel electrodes that is arrayed in a matrix above the substrate;
   a plurality of first organic functional layers that is disposed above the pixel electrodes, each of the first organic functional layers overlapping each of the pixel electrodes in one-to-one correspondence, and each of the first organic functional layers being spaced apart from one another;
   a hole injection layer disposed between the pixel electrodes and the first organic functional layers;
   an absence region disposed between adjacent ones of the first organic functional layers;
   a second organic functional layer that continuously covers the plurality of the first organic functional layers, and includes a portion that is disposed in the absence region and between the adjacent ones of the first organic functional layers; and
   a counter electrode disposed to face towards the pixel electrodes and covers a portion of the second organic functional layer,
   wherein
   each of the first organic functional layers includes a hole transport layer,
   the second organic functional layer has greater electric resistance than each of the first organic functional layers,
   the second organic functional layer is a laminate including organic light-emitting layers, an electron transport layer, and an electron injection layer, and
   at least one of the organic light-emitting layers extends into the absence region.

3. An organic EL display panel comprising:
   a substrate;
   pixel electrodes that are arrayed in a matrix above the substrate;
   first organic functional layers that are on or above the pixel electrodes in one-to-one correspondence with the pixel electrodes, the first organic functional layers spaced apart from one another;
   a second organic functional layer that continuously covers the first organic functional layers; and
   a counter electrode that opposes the pixel electrodes and covers the second organic functional layer, wherein
   each of the first organic functional layers includes a hole injection layer,
   the second organic functional layer has greater electric resistance than each of the first organic functional layers and has a portion extending into an absence region, the absence region being a space between adjacent ones of the first organic functional layers,
   each of the first organic functional layers is a laminate including the hole injection layer and a hole transport layer,
   the second organic functional layer is a laminate including organic light-emitting layers, an electron transport layer, and an electron injection layer, and
   each of the organic light-emitting layers extends into the absence region.

4. An organic EL display panel comprising:
   a substrate;
   pixel electrodes that are arrayed in a matrix above the substrate;
   first organic functional layers that are on or above the pixel electrodes in one-to-one correspondence with the pixel electrodes, the first organic functional layers spaced apart from one another;
   a second organic functional layer that continuously covers the first organic functional layers;
   a counter electrode that opposes the pixel electrodes and covers the second organic functional layer; and
   a hole injection layer between the pixel electrodes and the first organic functional layers,
   wherein
   each of the first organic functional layers includes a hole transport layer,
   the second organic functional layer has greater electric resistance than each of the first organic functional layers and has a portion extending into an absence region, the absence region being a space between adjacent ones of the first organic functional layers,
   the second organic functional layer is a laminate including organic light-emitting layers, an electron transport layer, and an electron injection layer, and
   at least one of the organic light-emitting layers extends into the absence region.

* * * * *